United States Patent
Gan et al.

(10) Patent No.: US 9,337,417 B2
(45) Date of Patent: May 10, 2016

(54) MAGNETIC RANDOM ACCESS MEMORY WITH PERPENDICULAR INTERFACIAL ANISOTROPY

(71) Applicant: Avalanche Technology Inc., Fremont, CA (US)

(72) Inventors: Huadong Gan, Fremont, CA (US); Yiming Huai, Pleasanton, CA (US); Zihui Wang, Milpitas, CA (US); Yuchen Zhou, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/195,427

(22) Filed: Mar. 3, 2014

(65) Prior Publication Data

US 2015/0102438 A1    Apr. 16, 2015

Related U.S. Application Data

(63) Continuation-in-part of application No. 14/053,231, filed on Oct. 14, 2013, now Pat. No. 9,070,855, which is a continuation-in-part of application No. 14/026,163, filed on Sep. 13, 2013, now Pat. No.
(Continued)

(51) Int. Cl.
| | |
|---|---|
| *H01L 27/22* | (2006.01) |
| *H01L 43/10* | (2006.01) |
| *H01F 10/32* | (2006.01) |
| *G11C 11/16* | (2006.01) |
| *H01F 41/30* | (2006.01) |
| *H01L 29/66* | (2006.01) |

(Continued)

(52) U.S. Cl.
CPC .............. *H01L 43/10* (2013.01); *G11C 11/161* (2013.01); *H01F 10/329* (2013.01); *H01F 10/3286* (2013.01); *H01F 41/302* (2013.01); *H01L 27/228* (2013.01); *H01L 29/66984* (2013.01); *H01L 43/08* (2013.01); *B82Y 40/00* (2013.01)

(58) Field of Classification Search
CPC ....... H01L 27/22; H01L 27/222; H01L 29/82; H01L 43/02; H01L 43/10
See application file for complete search history.

(56) References Cited

U.S. PATENT DOCUMENTS

| | | | |
|---|---|---|---|
| 7,602,000 B2 * | 10/2009 | Sun et al. ....................... | 257/295 |
| 2002/0135954 A1 * | 9/2002 | Yoshikawa ............. | B82Y 10/00 |
| | | | 360/324.12 |
| 2003/0200927 A1 | 10/2003 | Watanabe et al. | |

(Continued)

*Primary Examiner* — Michele Fan
(74) *Attorney, Agent, or Firm* — Bing K. Yen

(57) ABSTRACT

The present invention is directed to an MRAM element comprising a magnetic free layer structure and a magnetic reference layer structure with an insulating tunnel junction layer interposed therebetween. The magnetic free layer structure has a variable magnetization direction substantially perpendicular to the layer plane thereof. The magnetic reference layer structure includes a first magnetic reference layer formed adjacent to the insulating tunnel junction layer and a second magnetic reference layer separated from the first magnetic reference layer by a first non-magnetic perpendicular enhancement layer. The first and second magnetic reference layers have a first fixed magnetization direction substantially perpendicular to the layer plane thereof. The second magnetic reference layer has a multilayer structure comprising a first magnetic reference sublayer formed adjacent to the first non-magnetic perpendicular enhancement layer and a second magnetic reference sublayer separated from the first magnetic reference sublayer by an intermediate metallic layer.

11 Claims, 18 Drawing Sheets

Related U.S. Application Data 9,024,398, which is a continuation-in-part of application No. 13/029,054, filed on Feb. 16, 2011, now Pat. No. 8,598,576, and a continuation-in-part of application No. 13/277,187, filed on Oct. 19, 2011, now abandoned, which is a continuation-in-part of application No. 12/965,733, filed on Dec. 10, 2010, now Pat. No. 8,623,452.

(60) Provisional application No. 61/483,314, filed on May 6, 2011.

(51) Int. Cl.
 *H01L 43/08* (2006.01)
 *B82Y 40/00* (2011.01)

(56) References Cited

U.S. PATENT DOCUMENTS

| | | | |
|---|---|---|---|
| 2005/0276099 A1* | 12/2005 | Horng et al. | 365/158 |
| 2006/0098354 A1 | 5/2006 | Parkin | |
| 2007/0086121 A1* | 4/2007 | Nagase | B82Y 25/00 360/324.1 |
| 2007/0297220 A1* | 12/2007 | Yoshikawa | B82Y 25/00 365/158 |
| 2009/0079018 A1* | 3/2009 | Nagase | B82Y 25/00 257/421 |
| 2009/0080239 A1* | 3/2009 | Nagase | H01L 27/228 365/158 |
| 2009/0213503 A1* | 8/2009 | Sun et al. | 360/324.2 |
| 2009/0213638 A1* | 8/2009 | Morise | G11C 11/16 365/145 |
| 2010/0109110 A1* | 5/2010 | Wang | H01L 43/08 257/421 |
| 2010/0135067 A1* | 6/2010 | Dimitrov et al. | 365/158 |
| 2010/0230770 A1* | 9/2010 | Yoshikawa et al. | 257/421 |
| 2011/0062537 A1* | 3/2011 | Oh et al. | 257/421 |
| 2011/0064969 A1* | 3/2011 | Chen et al. | 428/800 |
| 2011/0188157 A1* | 8/2011 | Zhao | G11B 5/3906 360/313 |
| 2012/0039119 A1* | 2/2012 | Apalkov | B82Y 25/00 365/171 |
| 2012/0063220 A1* | 3/2012 | Higo et al. | 365/173 |
| 2012/0112297 A1* | 5/2012 | Yamakawa et al. | 257/421 |
| 2012/0217476 A1* | 8/2012 | Ikeno et al. | 257/16 |
| 2012/0286382 A1* | 11/2012 | Jan et al. | 257/421 |
| 2013/0099337 A1* | 4/2013 | Nakayama et al. | 257/421 |
| 2013/0099338 A1* | 4/2013 | Nakayama et al. | 257/421 |
| 2013/0175644 A1* | 7/2013 | Horng et al. | 257/421 |
| 2013/0187248 A1* | 7/2013 | Kariyada et al. | 257/425 |
| 2014/0284742 A1* | 9/2014 | Sawada et al. | 257/427 |

* cited by examiner

MAGNETIC RANDOM ACCESS MEMORY WITH PERPENDICULAR INTERFACIAL ANISOTROPY

CROSS-REFERENCE TO RELATED APPLICATIONS

This application is a continuation-in-part of the commonly assigned application bearing Ser. No. 14/053,231 filed on Oct. 14, 2013 by Gan et al. and entitled "Magnetic Random Access Memory Having Perpendicular Enhancement Layer," which is a continuation-in-part of the commonly assigned application bearing Ser. No. 14/026,163 filed on Sep. 13, 2013 by Gan et al. and entitled "Perpendicular STTMRAM Device with Balanced Reference Layer," which is a continuation-in-part of the commonly assigned application bearing Ser. No. 13/029,054 filed on Feb. 16, 2011 by Zhou et al. and entitled "Magnetic Random Access Memory With Field Compensating Layer and Multi-Level Cell," and a continuation-in-part of the commonly assigned application bearing Ser. No. 13/277,187 filed on Oct. 19, 2011 by Yiming Huai et al., and entitled "Memory System Having Thermally Stable Perpendicular Magneto Tunnel Junction (MTJ) and A Method of Manufacturing Same," which claims priority to U.S. Provisional Application No. 61/483,314. The present application is related to the commonly assigned copending application bearing Ser. No. 13/737,897 filed on Jan. 9, 2013, the commonly assigned copending application bearing Ser. No. 14/021,917 filed on Sep. 9, 2013, the commonly assigned copending application bearing Ser. No. 13/099,321 filed on May 2, 2011, the commonly assigned copending application bearing Ser. No. 13/928,263, and the commonly assigned copending application bearing Ser. No. 14/173,145 filed on Feb. 5, 2014.

BACKGROUND

The present invention relates to a magnetic random access memory (MRAM) device, and more particularly, to a spin transfer torque MRAM device including at least a perpendicular enhancement layer in its memory element.

Spin transfer torque magnetic random access memory (STT-MRAM) is a new class of non-volatile memory, which can retain the stored information when powered off. A STT-MRAM device normally comprises an array of memory cells, each of which includes at least a magnetic memory element and a selection element coupled in series between appropriate electrodes. Upon application of an appropriate voltage or current to the magnetic memory element, the electrical resistance of the magnetic memory element would change accordingly, thereby switching the stored logic in the respective memory cell.

FIG. 1 shows a conventional memory element for a STT-MRAM device comprising a magnetic reference layer 50 and a magnetic free layer 52 with an insulating tunnel junction layer 54 interposed therebetween, thereby collectively forming a magnetic tunneling junction (MTJ) 56. The magnetic reference layer 50 and free layer 52 have magnetization directions 58 and 60, respectively, which are substantially perpendicular to the layer plane. Therefore, the MTJ 56 is a perpendicular type comprising the magnetic layers 50 and 52 with perpendicular anisotropy. Upon application of an appropriate current through the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. However, when the magnetization directions 60 and 58 of the magnetic free layer 52 and reference layer 50 are substantially parallel, electrons polarized by the magnetic reference layer 50 can tunnel through the insulating tunnel junction layer 54, thereby decreasing the electrical resistivity of the perpendicular MTJ 56. Conversely, the electrical resistivity of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

One of many advantages of STT-MRAM over other types of non-volatile memories is scalability. As the size of the perpendicular MTJ 56 is reduced, the current required to switch the magnetization direction 60 of the magnetic free layer 52 is reduced accordingly, thereby reducing power consumption. However, the thermal stability of the magnetic layers 50 and 52, which is required for long term data retention, also degrades with miniaturization of the perpendicular MTJ 56.

For the foregoing reasons, there is a need for a STT-MRAM device that has a thermally stable perpendicular MTJ memory element and that can be inexpensively manufactured.

SUMMARY

The present invention is directed to a spin transfer torque (STT) magnetic random access memory (MRAM) device that satisfy this need. An STT-MRAM device having features of the present invention includes a plurality of magnetic tunnel junction (MTJ) memory elements. Each of the memory elements comprises a magnetic tunnel junction (MTJ) structure in between a non-magnetic seed layer and a non-magnetic cap layer. The MTJ structure comprises a magnetic free layer structure and a magnetic reference layer structure with an insulating tunnel junction layer interposed therebetween. The magnetic free layer structure has a variable magnetization direction substantially perpendicular to the layer plane thereof. The magnetic reference layer structure includes a first magnetic reference layer formed adjacent to the insulating tunnel junction layer and a second magnetic reference layer separated from the first magnetic reference layer by a first non-magnetic perpendicular enhancement layer. The first and second magnetic reference layers have a first fixed magnetization direction substantially perpendicular to the layer planes thereof. The second magnetic reference layer has a multilayer structure formed by interleaving two different types of materials with at least one of the two different types being magnetic. The MTJ structure may further comprise an anti-ferromagnetic coupling layer formed adjacent to the second magnetic reference layer and a magnetic fixed layer formed adjacent to the anti-ferromagnetic coupling layer with the magnetic fixed layer having a second fixed magnetization direction that is perpendicular to the layer plane thereof and is substantially opposite to the first fixed magnetization direction.

According to another aspect of the present invention as applied to a perpendicular MTJ memory element, the memory element includes a magnetic tunnel junction (MTJ) structure in between a non-magnetic seed layer and a non-magnetic cap layer. The MTJ structure comprises a magnetic free layer structure and a magnetic reference layer structure with an insulating tunnel junction layer interposed therebetween. The magnetic free layer structure has a variable magnetization direction substantially perpendicular to the layer plane thereof. The magnetic reference layer structure includes a first magnetic reference layer formed adjacent to the insulating tunnel junction layer and a second magnetic reference layer separated from the first magnetic reference layer by a first non-magnetic perpendicular enhancement layer. The first and second magnetic reference layers have a first fixed magnetization direction substantially perpendicular to the layer plane thereof. The second magnetic reference layer has a multilayer structure comprising a first magnetic reference sublayer formed adjacent to the first non-magnetic perpendicular enhancement layer and a second magnetic reference sublayer separated from the first magnetic reference sublayer by an intermediate metallic layer. The MTJ structure may further comprise an anti-ferromagnetic coupling layer formed adjacent to the second magnetic reference layer and a magnetic fixed layer formed adjacent to the anti-ferromagnetic coupling layer with the magnetic fixed layer having a second fixed magnetization direction that is perpendicular to the layer plane thereof and is substantially opposite to the first fixed magnetization direction.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

Figure 1:
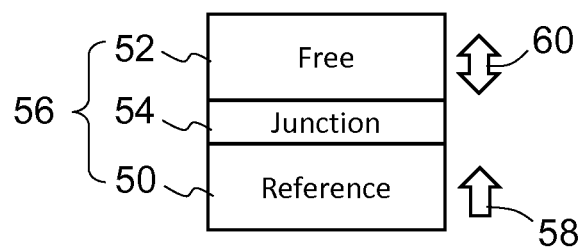
FIG. 1 is a schematic view of a conventional perpendicular magnetic tunnel junction.
Figure 2:
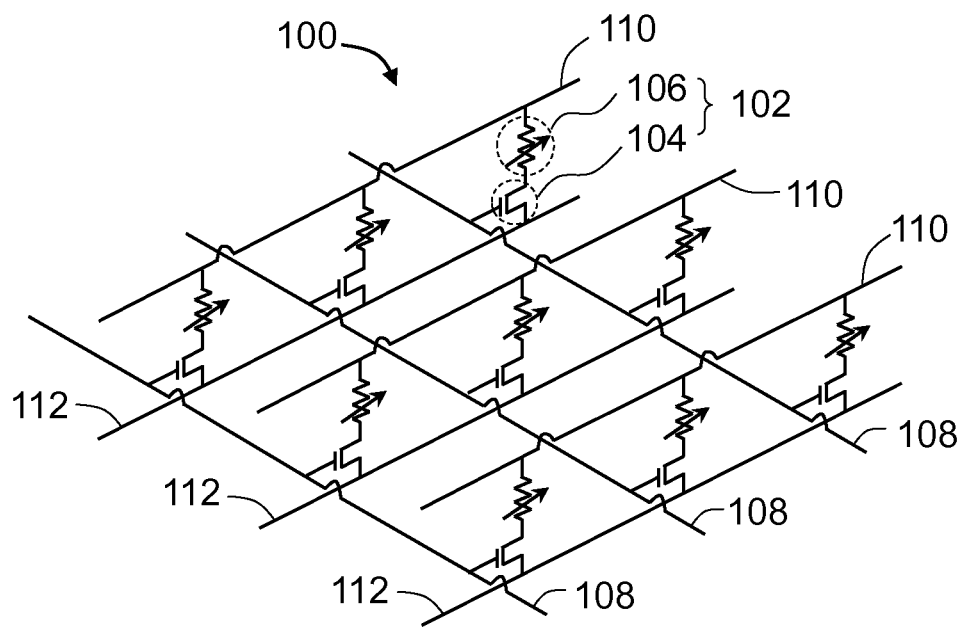
FIG. 2 is a schematic circuit diagram of a STT-MRAM device according to an embodiment of the present invention.

FIG. 2 is a schematic circuit diagram of a STT-MRAM device 100 according to an embodiment of the present invention. The STT-MRAM device 100 comprises a plurality of memory cells 102, each of the memory cells 102 including a selection transistor 104 coupled to a MTJ memory element 106; a plurality of parallel word lines 108 with each being coupled to a respective row of the selection transistors 104 in a first direction; and a plurality of parallel bit lines 110 with each being coupled to a respective row of the memory elements 106 in a second direction perpendicular to the first direction; and optionally a plurality of parallel source lines 112 with each being coupled to a respective row of the selection transistors 104 in the first or second direction.

Figure 3A:
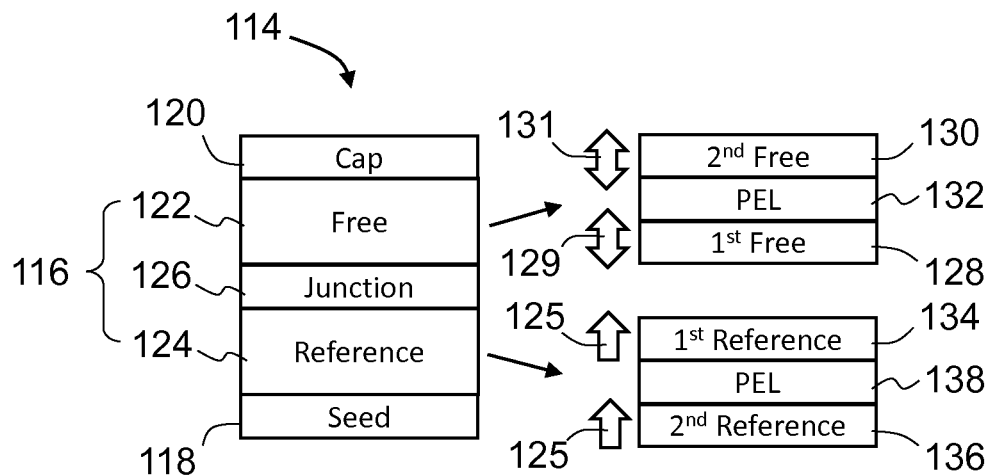
FIGS. 3A and 3B are schematic views of an embodiment of the present invention as applied to a perpendicular MTJ memory element.

The MTJ memory element 106 has a perpendicular MTJ structure that includes at least a perpendicular enhancement layer (PEL) to improve the perpendicular anisotropy of magnetic layers adjacent thereto. An embodiment of the present invention as applied to a perpendicular MTJ memory element will now be described with reference to FIG. 3A. Referring now to FIG. 3A, the illustrated memory element 114 includes a magnetic tunnel junction (MTJ) structure 116 in between a non-magnetic seed layer 118 and a non-magnetic cap layer 120. The MTJ structure 116 comprises a magnetic free layer structure 122 and a magnetic reference layer structure 124 with an insulating tunnel junction layer 126 interposed therebetween. The magnetic reference layer structure 124 and the magnetic free layer structure 122 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a first non-magnetic perpendicular enhancement layer (PEL) 132. The magnetic reference layer structure 124 includes a first magnetic reference layer 134 formed adjacent to the insulating tunnel junction layer 126 and a second magnetic reference layer 136 separated from the first magnetic reference layer 134 by a second non-magnetic perpendicular enhancement layer 138. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The first and second magnetic reference layers 134 and 136 have a first fixed magnetization direction 125 substantially perpendicular to the layer plane thereof.

Figure 3B:
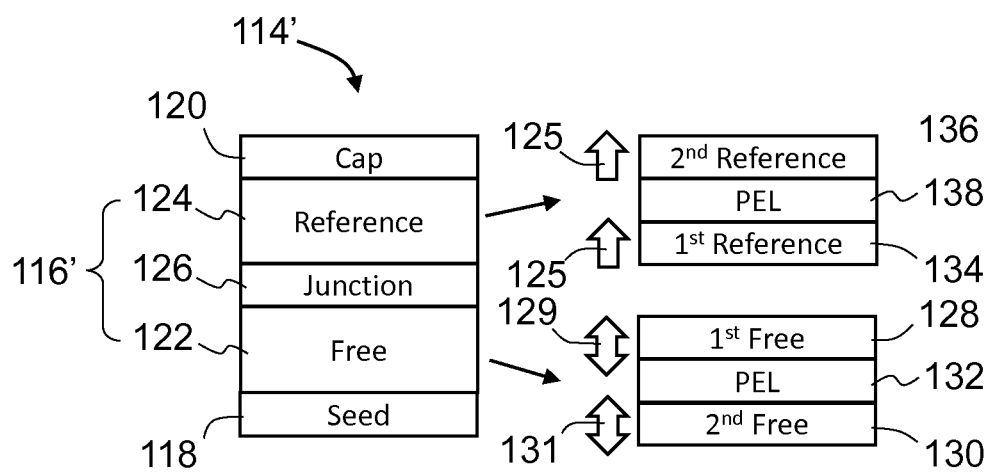

The stacking order of the individual layers in the MTJ structure 116 of the memory element 114 may be inverted without affecting the device performance as illustrated in FIG. 3B. The memory element 114' of FIG. 3B has a MTJ structure 116' that has the same layers but with the inverted stacking order comparing to the MTJ structure 116. Accordingly, the magnetic free layer structure 122 and the magnetic reference layer structure 124 are formed adjacent to the non-magnetic seed layer 118 and cap layer 120, respectively.

Figure 4A:
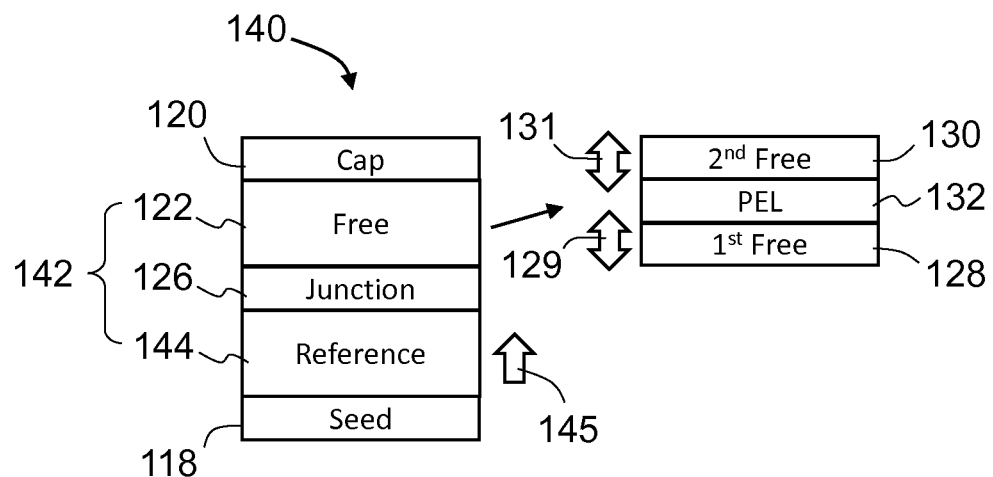
FIGS. 4A and 4B are schematic views of another embodiment of the present invention as applied to a perpendicular MTJ memory element.

Another embodiment of the present invention as applied to a MTJ memory element is illustrated in FIG. 4A. The memory element 140 includes a magnetic tunnel junction (MTJ) structure 142 in between a non-magnetic seed layer 118 and a non-magnetic cap layer 120. The MTJ structure 142 comprises a magnetic free layer structure 122 and a magnetic reference layer structure 144 with an insulating tunnel junction layer 126 interposed therebetween. The magnetic reference layer structure 144 and the magnetic free layer structure 122 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a non-magnetic perpendicular enhancement layer (PEL) 132. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The magnetic reference layer structure 144 has a fixed magnetization direction 145 substantially perpendicular to the layer plane thereof. The memory element 140 of FIG. 4A is different from the memory element 114 of FIG. 3A in that the magnetic reference layer structure 144 is formed of a single magnetic layer.

Figure 4B:
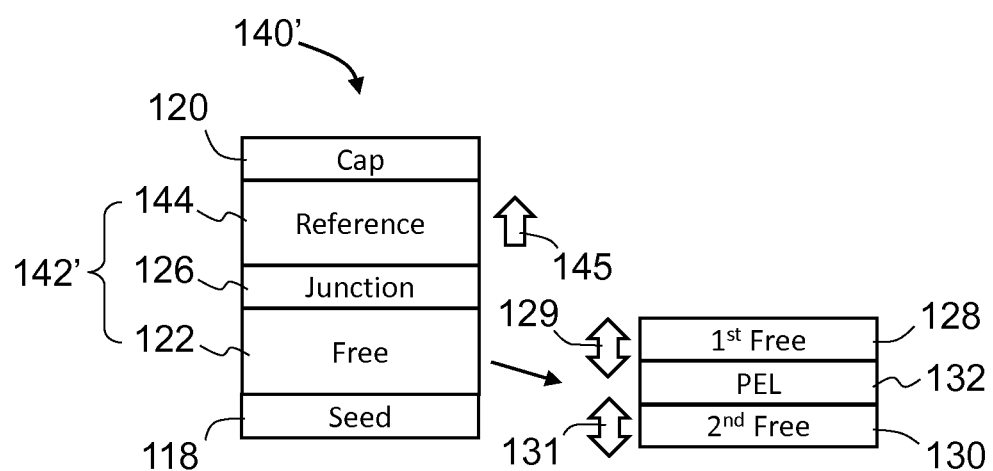

The stacking order of the individual layers in the MTJ structure 142 of the memory element 140 may be inverted without affecting the device performance as illustrated in FIG. 4B. The memory element 140' of FIG. 4B has a MTJ structure 142' that has the same layers but with the inverted stacking order comparing to the MTJ structure 142. Accordingly, the magnetic free layer structure 122 and the magnetic reference layer structure 144 are formed adjacent to the non-magnetic seed layer 118 and cap layer 120, respectively.

Figure 5A:
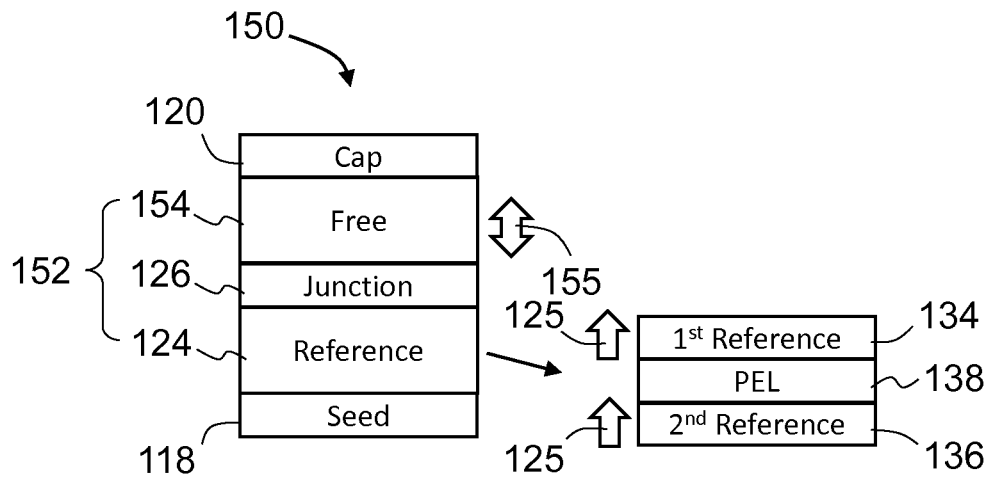
FIGS. 5A and 5B are schematic views of still another embodiment of the present invention as applied to a perpendicular MTJ memory element.

Still another embodiment of the present invention as applied to a MTJ memory element is illustrated in FIG. 5A. The memory element 150 includes a magnetic tunnel junction (MTJ) structure 152 in between a non-magnetic seed layer 118 and a non-magnetic cap layer 120. The MTJ structure 152 comprises a magnetic free layer structure 154 and a magnetic reference layer structure 124 with an insulating tunnel junction layer 126 interposed therebetween. The magnetic reference layer structure 124 and the magnetic free layer structure 154 are formed adjacent to the non-magnetic seed layer 118 and cap layer 120, respectively. The magnetic reference layer structure 124 includes a first magnetic reference layer 134 formed adjacent to the insulating tunnel junction layer 126 and a second magnetic reference layer 136 separated from the first magnetic reference layer 134 by a non-magnetic perpendicular enhancement layer 138. The magnetic free layer structure 154 has a variable magnetization direction 155 substantially perpendicular to the layer plane thereof. The first and second magnetic reference layers 134 and 136 have a first fixed magnetization direction 125 substantially perpendicular to the layer plane thereof. The memory element 150 of FIG. 5A is different from the memory element 114 of FIG. 3A in that the magnetic free layer structure 154 is formed of a single magnetic layer.

Figure 5B:
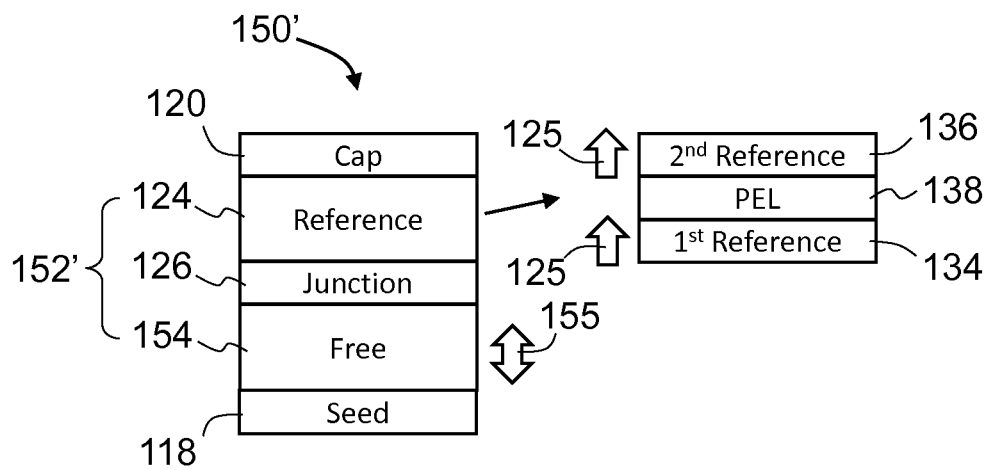

The stacking order of the individual layers in the MTJ structure 152 of the memory element 150 may be inverted without affecting the device performance as illustrated in FIG. 5B. The memory element 150' of FIG. 5B has a MTJ structure 152' that has the same layers but with the inverted stacking order comparing to the MTJ structure 152. Accordingly, the magnetic free layer structure 154 and the magnetic reference layer structure 124 are formed adjacent to the non-magnetic seed layer 118 and cap layer 120, respectively.

The non-magnetic seed layer 118 of the memory elements 114, 114', 140, 140', 150, and 150' of FIGS. 3A, 3B, 4A, 4B, 5A, and 5B, respectively, facilitates the optimal growth of the magnetic layer thereon to increase perpendicular anisotropy. The non-magnetic seed layer 118 may also serves as a bottom electrode to the MTJ structures 116, 116', 142, 142', 152, and 152'.

The non-magnetic cap layer 120 of the memory elements 114, 114', 140, 140', 150, and 150' of FIGS. 3A, 3B, 4A, 4B, 5A, and 5B, respectively, functions as a top electrode to the MTJ structures 116, 116', 142, 142', 152, and 152', but may also improve the perpendicular anisotropy of the magnetic layer adjacent thereto during annealing.

For the MTJ structures 116, 116', 142, 142', 152, and 152' of FIGS. 3A, 3B, 4A, 4B, 5A, and 5B, at least one of the magnetic free layer structure 122 and the magnetic reference layer structure 124 includes a non-magnetic perpendicular enhancement layer 132 or 138 therein. The perpendicular enhancement layers 132 and 138 further improve the perpendicular anisotropy of the magnetic layers adjacent thereto during deposition and annealing.

Figure 6A:
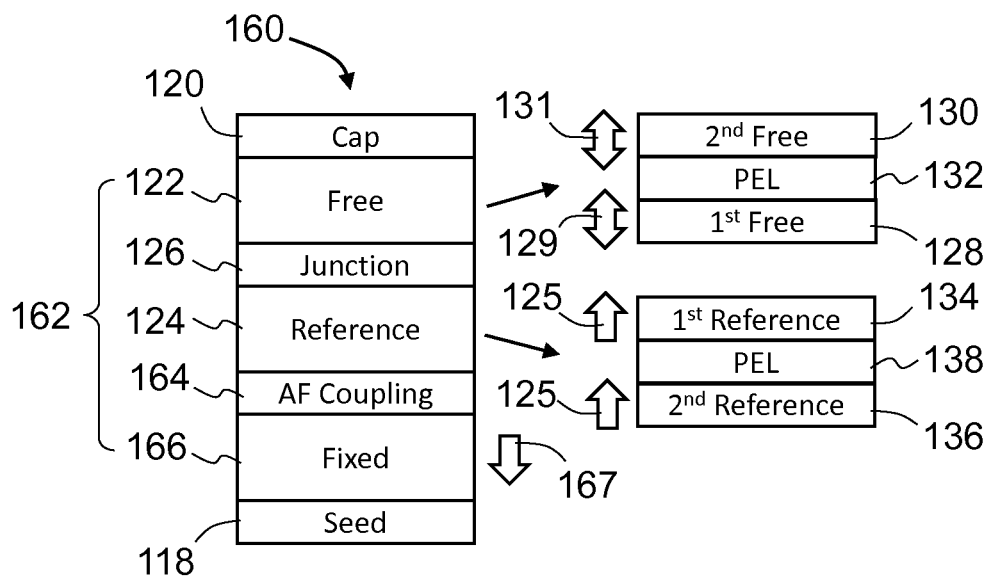
FIGS. 6A and 6B are schematic views of yet another embodiment of the present invention as applied to a perpendicular MTJ memory element.

Yet another embodiment of the present invention as applied to a MTJ memory element is illustrated in FIG. 6A. The memory element 160 includes a magnetic tunnel junction (MTJ) structure 162 in between a non-magnetic seed layer 118 and a non-magnetic cap layer 120. The MTJ structure 162 comprises a magnetic free layer structure 122 and a magnetic reference layer structure 124 with an insulating tunnel junction layer 126 interposed therebetween, an anti-ferromagnetic coupling layer 164 formed adjacent to the magnetic reference layer structure 124, and a magnetic fixed layer 166 formed adjacent to the anti-ferromagnetic coupling layer 164. The magnetic fixed layer structure 166 and the magnetic free layer structure 122 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a first non-magnetic perpendicular enhancement layer (PEL) 132. The magnetic reference layer structure 124 includes a first magnetic reference layer 134 formed adjacent to the insulating tunnel junction layer 126 and a second magnetic reference layer 136 separated from the first magnetic reference layer 134 by a second non-magnetic perpendicular enhancement layer 138. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The first and second magnetic reference layers 134 and 136 have a first fixed magnetization direction 125 substantially perpendicular to the layer plane thereof. The magnetic fixed layer 166 has a second fixed magnetization direction 167 substantially opposite to the first fixed magnetization direction 125. The memory element 160 of FIG. 6A is different from the memory element 114 of FIG. 3A in that the anti-ferromagnetic coupling layer 164 and the magnetic fixed layer 166 have been inserted in between the non-magnetic seed layer 118 and the magnetic reference layer structure 124.

Figure 6B:
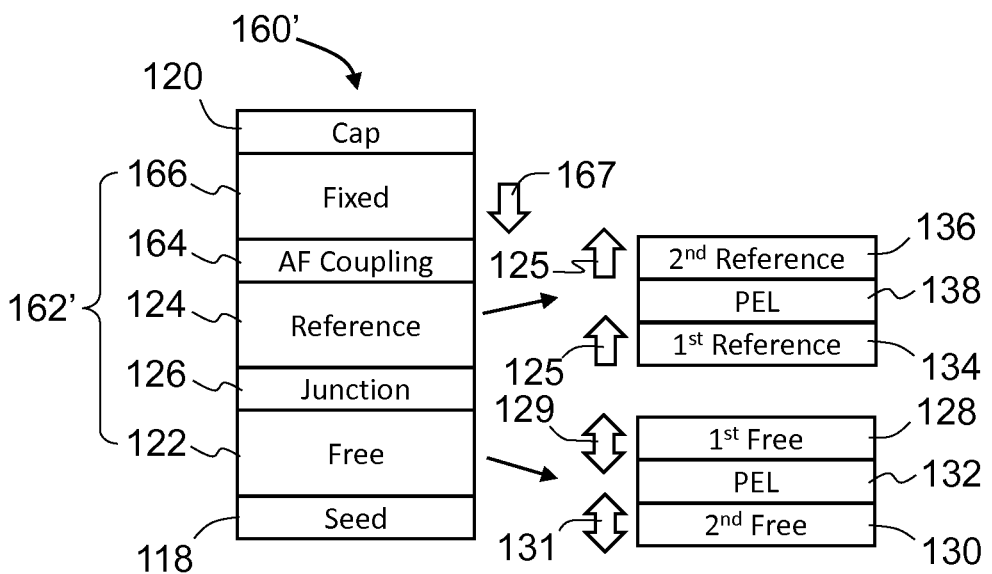

The stacking order of the individual layers in the MTJ structure 162 of the memory element 160 may be inverted without affecting the device performance as illustrated in FIG. 6B. The memory element 160' of FIG. 6B has a MTJ structure 162' that has the same layers but with the inverted stacking order comparing to the MTJ structure 162. Accordingly, the magnetic free layer structure 122 and the magnetic fixed layer 166 are formed adjacent to the non-magnetic seed layer 118 and cap layer 120, respectively.

Figure 7A:
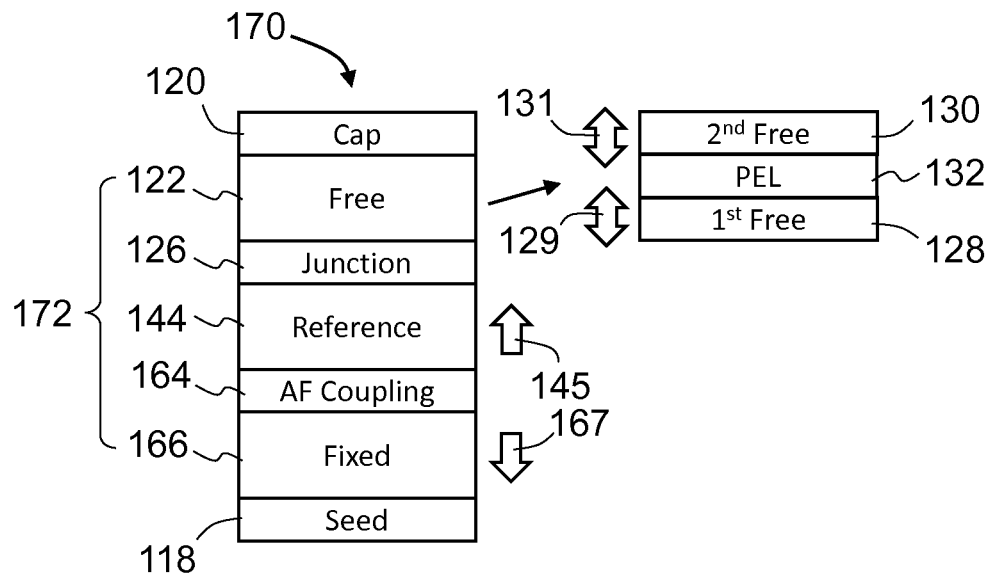
FIGS. 7A and 7B are schematic views of still yet another embodiment of the present invention as applied to a perpendicular MTJ memory element.

Still yet another embodiment of the present invention as applied to a MTJ memory element is illustrated in FIG. 7A. The memory element 170 includes a magnetic tunnel junction (MTJ) structure 172 in between a non-magnetic seed layer 118 and a non-magnetic cap layer 120. The MTJ structure 172 comprises a magnetic free layer structure 122 and a magnetic reference layer structure 144 with an insulating tunnel junction layer 126 interposed therebetween, an anti-ferromagnetic coupling layer 164 formed adjacent to the magnetic reference layer structure 144, and a magnetic fixed layer 166 formed adjacent to the anti-ferromagnetic coupling layer 164. The magnetic fixed layer structure 166 and the magnetic free layer structure 122 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a non-magnetic perpendicular enhancement layer (PEL) 132. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The magnetic reference layer structure 144 has a first fixed magnetization direction 145 substantially perpendicular to the layer plane thereof. The magnetic fixed layer 166 has a second fixed magnetization direction 167 substantially opposite to the first fixed magnetization direction 145. The memory element 170 of FIG. 7A is different from the memory element 160 of FIG. 6A in that the magnetic reference layer structure 144 is formed of a single magnetic layer.

Figure 7B:
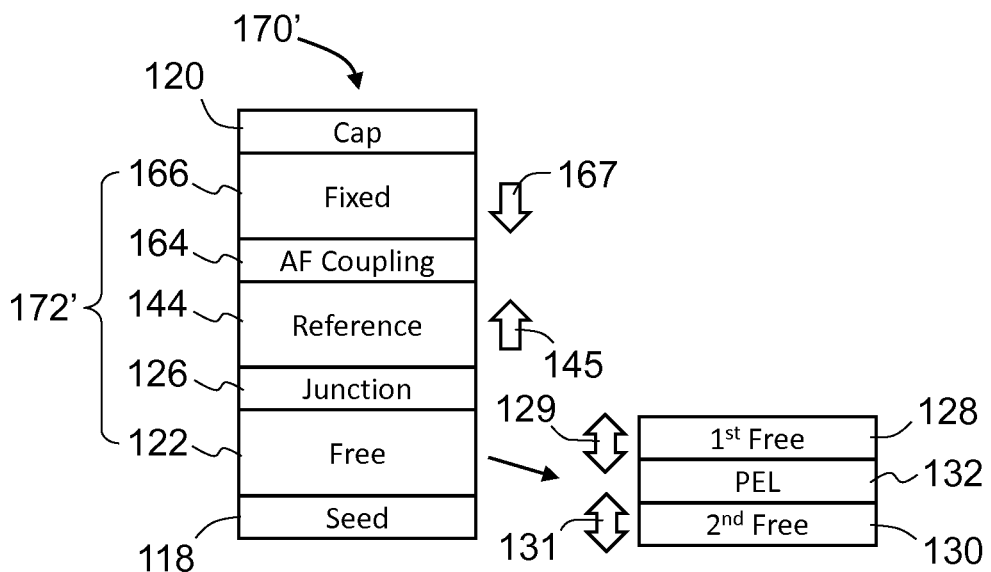

The stacking order of the individual layers in the MTJ structure 172 of the memory element 170 may be inverted without affecting the device performance as illustrated in FIG. 7B. The memory element 170' of FIG. 7B has a MTJ structure 172' that has the same layers but with the inverted stacking order comparing to the MTJ structure 172. Accordingly, the magnetic free layer structure 122 and the magnetic fixed layer structure 166 are formed adjacent to the non-magnetic seed layer 118 and cap layer 120, respectively.

Figure 8A:
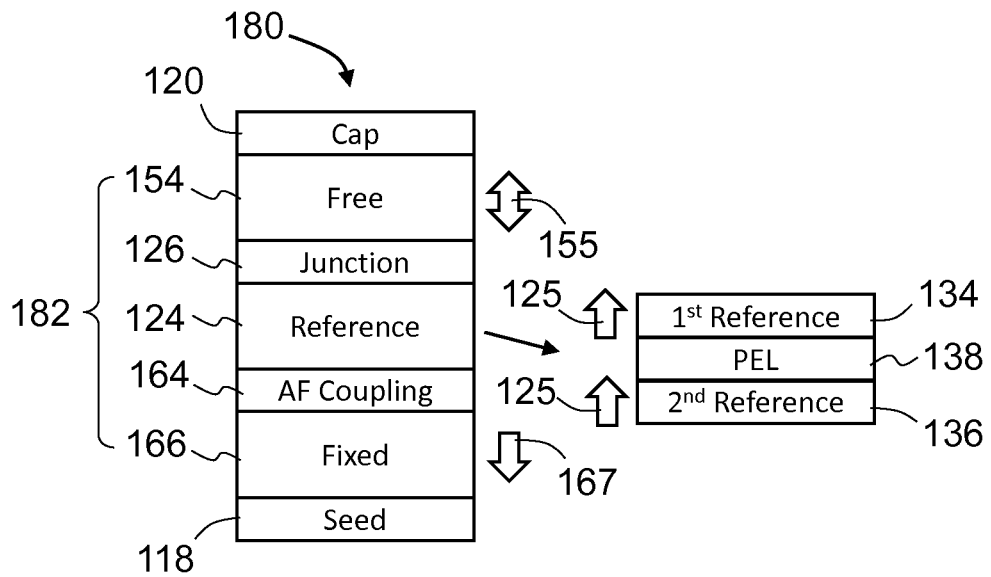
FIGS. 8A and 8B are schematic views of yet still another embodiment of the present invention as applied to a perpendicular MTJ memory element.

Yet still another embodiment of the present invention as applied to a MTJ memory element is illustrated in FIG. 8A. The memory element 180 includes a magnetic tunnel junction (MTJ) structure 182 in between a non-magnetic seed layer 118 and a non-magnetic cap layer 120. The MTJ structure 182 comprises a magnetic free layer structure 154 and a magnetic reference layer structure 124 with an insulating tunnel junction layer 126 interposed therebetween, an anti-ferromagnetic coupling layer 164 formed adjacent to the magnetic reference layer structure 124, and a magnetic fixed layer 166 formed adjacent to the anti-ferromagnetic coupling layer 164. The magnetic fixed layer structure 166 and the magnetic free layer structure 122 are formed adjacent to the non-magnetic seed layer 118 and cap layer 120, respectively. The magnetic reference layer structure 124 includes a first magnetic reference layer 134 formed adjacent to the insulating tunnel junction layer 126 and a second magnetic reference layer 136 separated from the first magnetic reference layer 134 by a non-magnetic perpendicular enhancement layer 138. The magnetic free layer structure 154 has a variable magnetization direction 155 substantially perpendicular to the layer plane thereof. The first and second magnetic reference layers 134 and 136 have a first fixed magnetization direction 125 substantially perpendicular to the layer plane thereof. The magnetic fixed layer 166 has a second fixed magnetization direction 167 substantially opposite to the first fixed magnetization direction 125. The memory element 180 of FIG. 8A is different from the memory element 160 of FIG. 6A in that the magnetic free layer structure 154 is formed of a single magnetic layer.

Figure 8B:
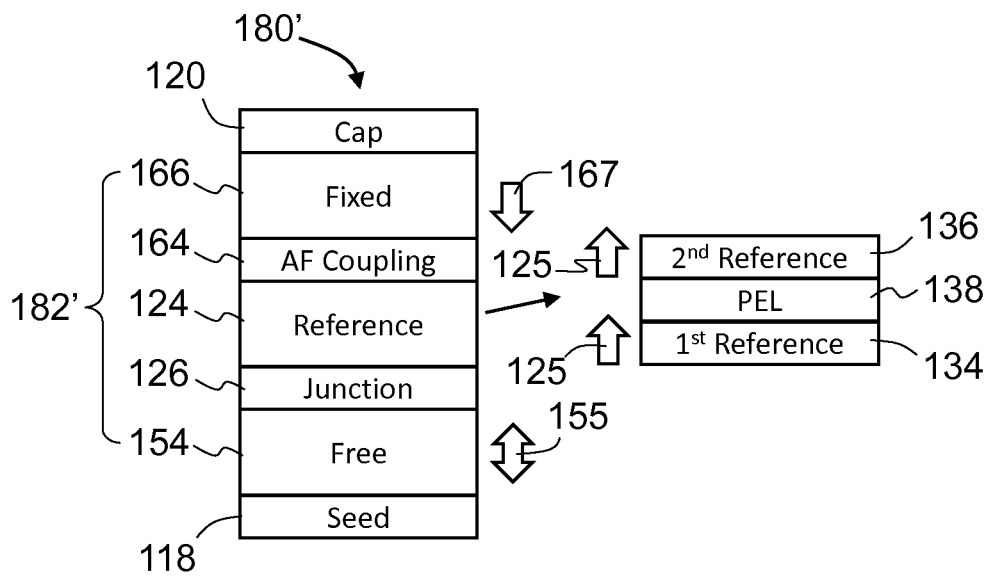

The stacking order of the individual layers in the MTJ structure 182 of the memory element 180 may be inverted without affecting the device performance as illustrated in FIG. 8B. The memory element 180' of FIG. 8B has a MTJ structure 182' that has the same layers but with the inverted stacking order comparing to the MTJ structure 182. Accordingly, the magnetic free layer structure 154 and the magnetic fixed layer structure 166 are formed adjacent to the non-magnetic seed layer 118 and cap layer 120, respectively.

Comparing with the MTJ structures 116, 116', 142, 142', 152, and 152' of FIGS. 3A, 3B, 4A, 4B, 5A, and 5B, respectively, the MTJ structures 162, 162', 172, 172', 182, and 182' of FIGS. 6A, 6B, 7A, 7B, 8A, and 8B, respectively, have the magnetic fixed layer 166 anti-ferromagnetically coupled to the reference layers 124 and 144 through the anti-ferromagnetic coupling layer 164. The magnetic fixed layer 166 is not an "active" layer like the magnetic reference layer structure and the magnetic free layer structure, which along with the tunnel junction layer 126 collectively form a MTJ that changes resistivity when a spin-polarized current pass therethrough. The main function of the magnetic fixed layer 166, which has an opposite magnetization direction compared with the magnetic reference layer structures 124 and 144, is to cancel, as much as possible, the external magnetic field exerted by the magnetic reference layer structures 124 and 144 on the magnetic free layer structures 122 and 154, thereby minimizing the offset field or net external field in the magnetic free layer structures 122 and 154.

Figure 9A:
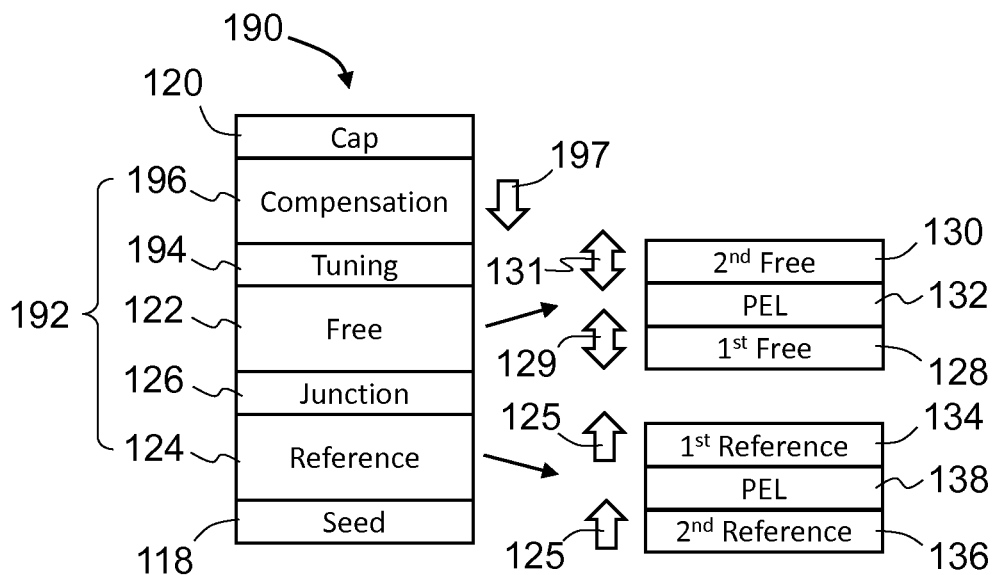
FIGS. 9A and 9B are schematic views of still yet another embodiment of the present invention as applied to a perpendicular MTJ memory element.

Still yet another embodiment of the present invention as applied to a MTJ memory element is illustrated in FIG. 9A. The memory element 190 includes a magnetic tunnel junction (MTJ) structure 192 in between a non-magnetic seed layer 118 and a non-magnetic cap layer 120. The MTJ structure 192 comprises a magnetic free layer structure 122 and a magnetic reference layer structure 124 with an insulating tunnel junction layer 126 interposed therebetween, a non-magnetic tuning layer 194 formed adjacent to the magnetic free layer structure 122, and a magnetic compensation layer 196 formed adjacent to the non-magnetic tuning layer 194. The magnetic reference layer structure 124 and the magnetic compensation layer 196 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a first non-magnetic perpendicular enhancement layer (PEL) 132. The magnetic reference layer structure 124 includes a first magnetic reference layer 134 formed adjacent to the insulating tunnel junction layer 126 and a second magnetic reference layer 136 separated from the first magnetic reference layer 134 by a second non-magnetic perpendicular enhancement layer 138. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The first and second magnetic reference layers 134 and 136 have a first fixed magnetization direction 125 substantially perpendicular to the layer plane thereof. The magnetic compensation layer 196 has a second fixed magnetization direction 197 substantially opposite to the first fixed magnetization direction 125. The memory element 190 of FIG. 9A is different from the memory element 114 of FIG. 3A in that the non-magnetic tuning layer 194 and the magnetic compensation layer 196 have been inserted in between the magnetic free layer structure 122 and the non-magnetic cap layer 120.

Figure 9B:
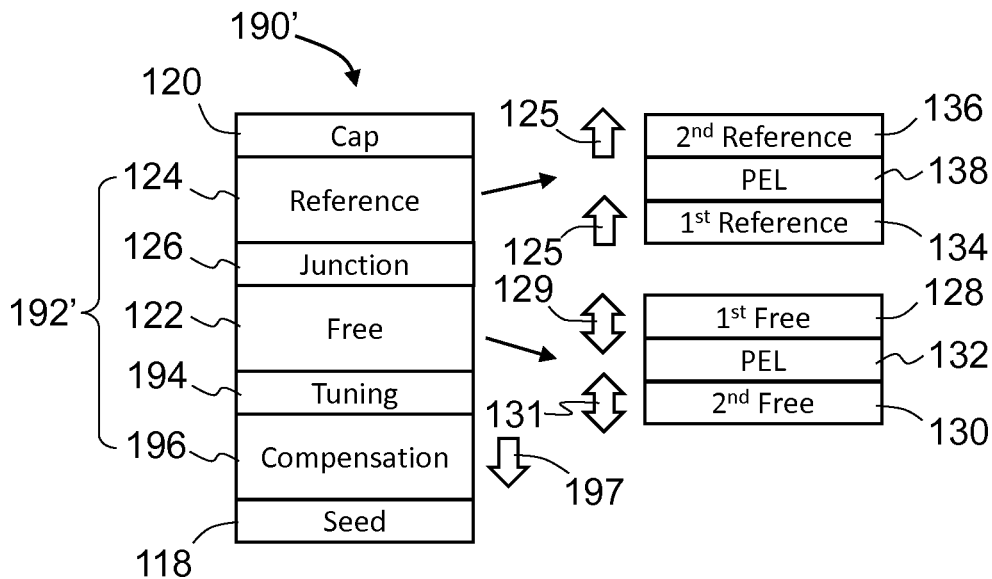

The stacking order of the individual layers in the MTJ structure 192 of the memory element 190 may be inverted without affecting the device performance as illustrated in FIG. 9B. The memory element 190' of FIG. 9B has a MTJ structure 192' that has the same layers but with the inverted stacking order comparing to the MTJ structure 192. Accordingly, the magnetic compensation layer 196 and the magnetic reference layer structure 124 are formed adjacent to the non-magnetic seed layer 118 and cap layer 120, respectively.

Figure 10A:
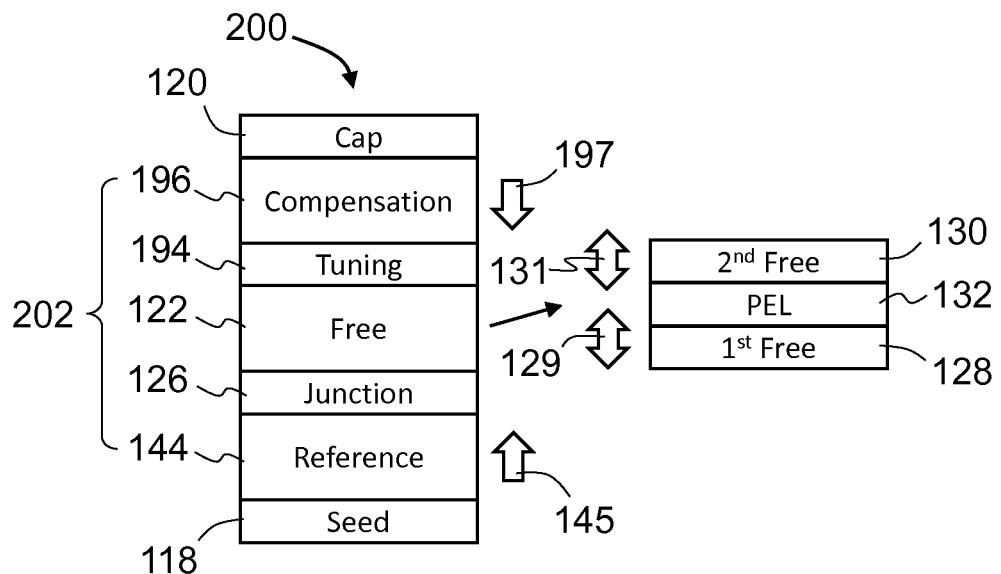
FIGS. 10A and 10B are schematic views of yet still another embodiment of the present invention as applied to a perpendicular MTJ memory element.

Yet still another embodiment of the present invention as applied to a MTJ memory element is illustrated in FIG. 10A. The memory element 200 includes a magnetic tunnel junction (MTJ) structure 202 in between a non-magnetic seed layer 118 and a non-magnetic cap layer 120. The MTJ structure 202 comprises a magnetic free layer structure 122 and a magnetic reference layer structure 144 with an insulating tunnel junction layer 126 interposed therebetween, a non-magnetic tuning layer 194 formed adjacent to the magnetic free layer structure 122, and a magnetic compensation layer 196 formed adjacent to the non-magnetic tuning layer 194. The magnetic reference layer structure 144 and the magnetic compensation layer 196 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a non-magnetic perpendicular enhancement layer (PEL) 132. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The magnetic reference layer structure 144 has a first fixed magnetization direction 145 substantially perpendicular to the layer plane thereof. The magnetic compensation layer 196 has a second fixed magnetization direction 197 substantially opposite to the first fixed magnetization direction 145. The memory element 200 of FIG. 10A is different from the memory element 190 of FIG. 9A in that the magnetic reference layer structure 144 is formed of a single magnetic layer.

Figure 10B:
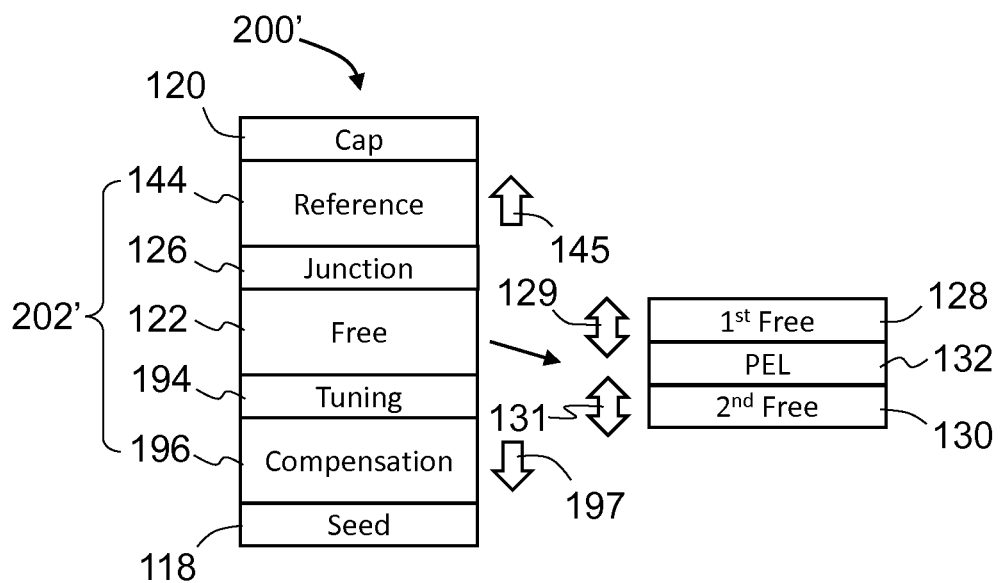

The stacking order of the individual layers in the MTJ structure 202 of the memory element 200 may be inverted without affecting the device performance as illustrated in FIG. 10B. The memory element 200' of FIG. 10B has a MTJ structure 202' that has the same layers but with the inverted stacking order comparing to the MTJ structure 202. Accordingly, the magnetic compensation layer 196 and the magnetic reference layer structure 144 are formed adjacent to the non-magnetic seed layer 118 and cap layer 120, respectively.

Figure 11A:
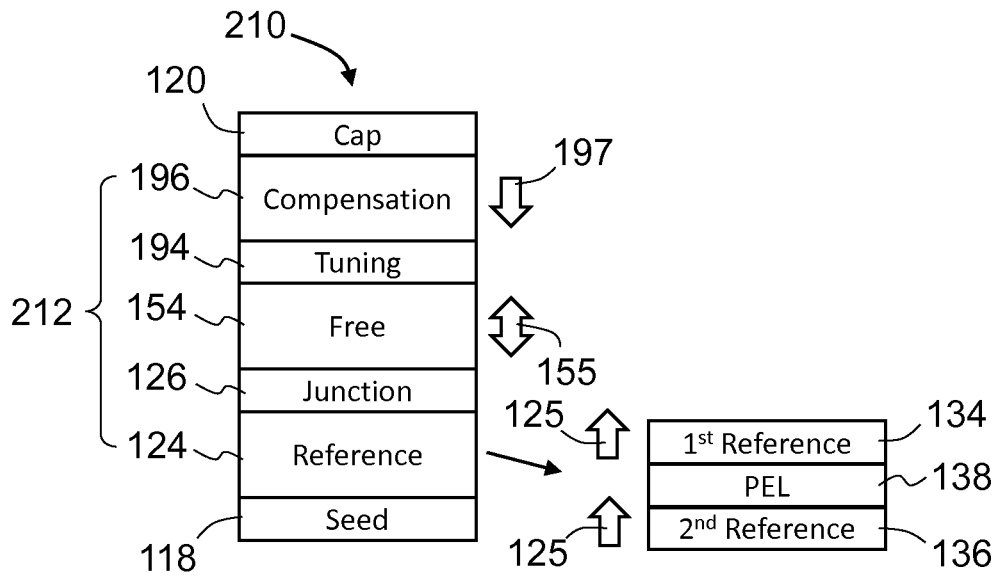
FIGS. 11A and 11B are schematic views of still yet another embodiment of the present invention as applied to a perpendicular MTJ memory element.

Still yet another embodiment of the present invention as applied to a MTJ memory element is illustrated in FIG. 11A. The memory element 210 includes a magnetic tunnel junction (MTJ) structure 212 in between a non-magnetic seed layer 118 and a non-magnetic cap layer 120. The MTJ structure 212 comprises a magnetic free layer structure 154 and a magnetic reference layer structure 124 with an insulating tunnel junction layer 126 interposed therebetween, a non-magnetic tuning layer 194 formed adjacent to the magnetic free layer structure 122, and a magnetic compensation layer 196 formed adjacent to the non-magnetic tuning layer 194. The magnetic reference layer structure 124 and the magnetic compensation layer 196 are formed adjacent to the non-magnetic seed layer 118 and cap layer 120, respectively. The magnetic reference layer structure 124 includes a first magnetic reference layer 134 formed adjacent to the insulating tunnel junction layer 126 and a second magnetic reference layer 136 separated from the first magnetic reference layer 134 by a non-magnetic perpendicular enhancement layer 138. The magnetic free layer structure 154 has a variable magnetization direction 155 substantially perpendicular to the layer plane thereof. The first and second magnetic reference layers 134 and 136 have a first fixed magnetization direction 125 substantially perpendicular to the layer plane thereof. The magnetic compensation layer 196 has a second fixed magnetization direction 197 substantially opposite to the first fixed magnetization direction 125. The memory element 210 of FIG. 11A is different from the memory element 190 of FIG. 9A in that the magnetic free layer structure 154 is formed of a single magnetic layer.

Figure 11B:
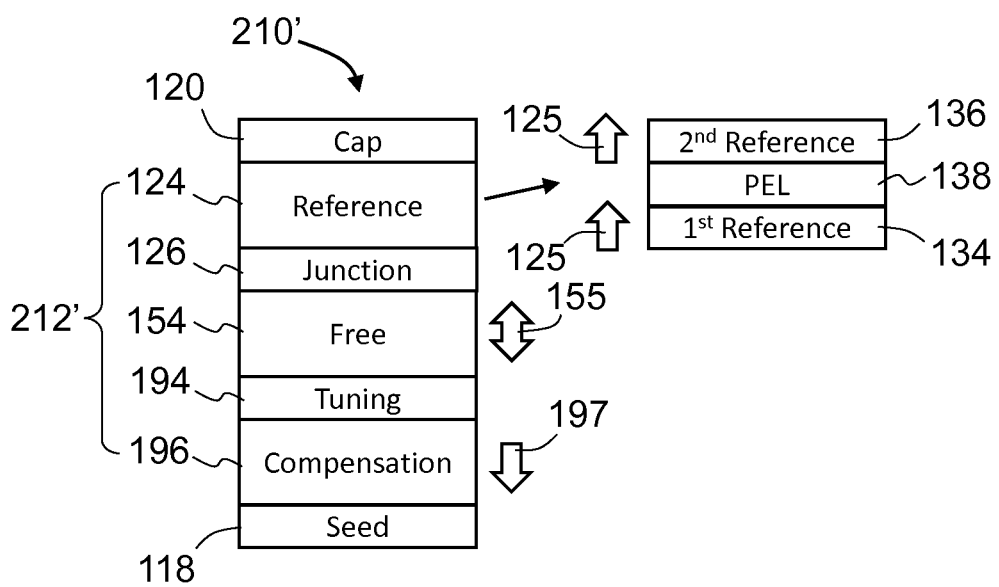

The stacking order of the individual layers in the MTJ structure 212 of the memory element 210 may be inverted without affecting the device performance as illustrated in FIG. 11B. The memory element 210' of FIG. 11B has a MTJ structure 212' that has the same layers but with the inverted stacking order comparing to the MTJ structure 212. Accordingly, the magnetic compensation layer 196 and the magnetic reference layer structure 124 are formed adjacent to the non-magnetic seed layer 118 and cap layer 120, respectively.

Figure 12A:
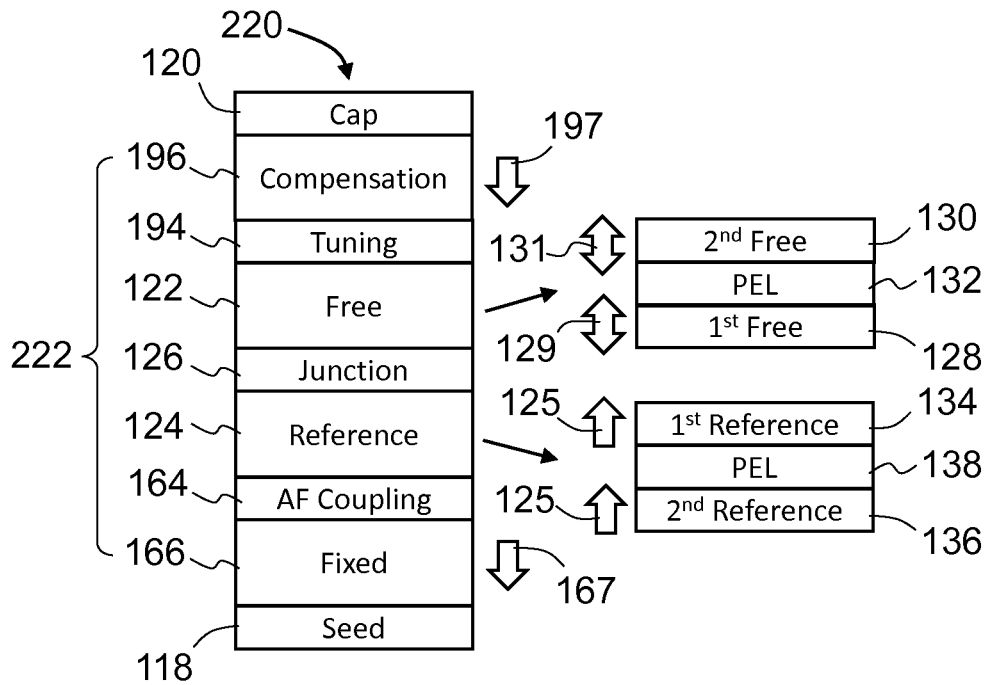
FIGS. 12A and 12B are schematic views of yet still another embodiment of the present invention as applied to a perpendicular MTJ memory element.

Yet still another embodiment of the present invention as applied to a perpendicular MTJ memory element is illustrated in FIG. 12A. The memory element 220 includes a magnetic tunnel junction (MTJ) structure 222 in between a non-magnetic seed layer 118 and a non-magnetic cap layer 120. The MTJ structure 220 comprises a magnetic free layer structure 122 and a magnetic reference layer structure 124 with an insulating tunnel junction layer 126 interposed therebetween, a non-magnetic tuning layer 194 formed adjacent to the magnetic free layer structure 122 opposite the insulating tunnel junction layer 126, a magnetic compensation layer 196 formed adjacent to the non-magnetic tuning layer 194 opposite the magnetic free layer structure 122, an anti-ferromagnetic coupling layer 164 formed adjacent to the magnetic reference layer structure 124 opposite the insulating tunnel junction layer 126, and a magnetic fixed layer 166 formed adjacent to the anti-ferromagnetic coupling layer 164 opposite the magnetic reference layer structure 124. The magnetic fixed layer 166 and the magnetic compensation layer 196 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a first non-magnetic perpendicular enhancement layer (PEL) 132. The magnetic reference layer structure 124 includes a first magnetic reference layer 134 formed adjacent to the insulating tunnel junction layer 126 and a second magnetic reference layer 136 separated from the first magnetic reference layer 134 by a second non-magnetic perpendicular enhancement layer 138. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The first and second magnetic reference layers 134 and 136 have a first fixed magnetization direction 125 substantially perpendicular to the layer plane thereof. The magnetic compensation layer 196 has a second fixed magnetization direction 197 substantially opposite to the first fixed magnetization direction 125. The magnetic fixed layer 166 has a third fixed magnetization direction 167 that is substantially perpendicular to the layer plane thereof and is substantially opposite to the first fixed magnetization direction 125. The memory element 220 of FIG. 12A is different from the memory element 190 of FIG. 9A in that the magnetic fixed layer 166 and the anti-ferromagnetic coupling layer 164 have been inserted in between the magnetic reference layer structure 124 and the non-magnetic seed layer 118.

Figure 12B:
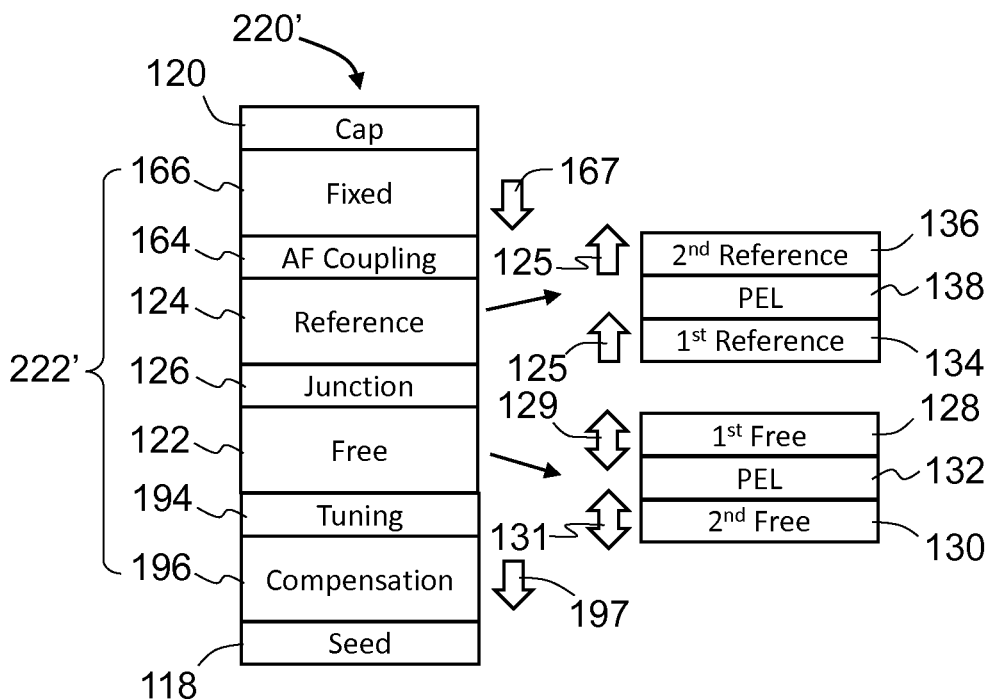

The stacking order of the individual layers in the MTJ structure 222 of the memory element 220 may be inverted as illustrated in FIG. 12B without affecting the device performance. The memory element 220' of FIG. 12B has a MTJ structure 222' that has the same layers but with the inverted stacking order comparing with the MTJ structure 222. Accordingly, the magnetic compensation layer 196 and the magnetic fixed layer 166 are formed adjacent to the non-magnetic seed layer 118 and cap layer 120, respectively.

Figure 13A:
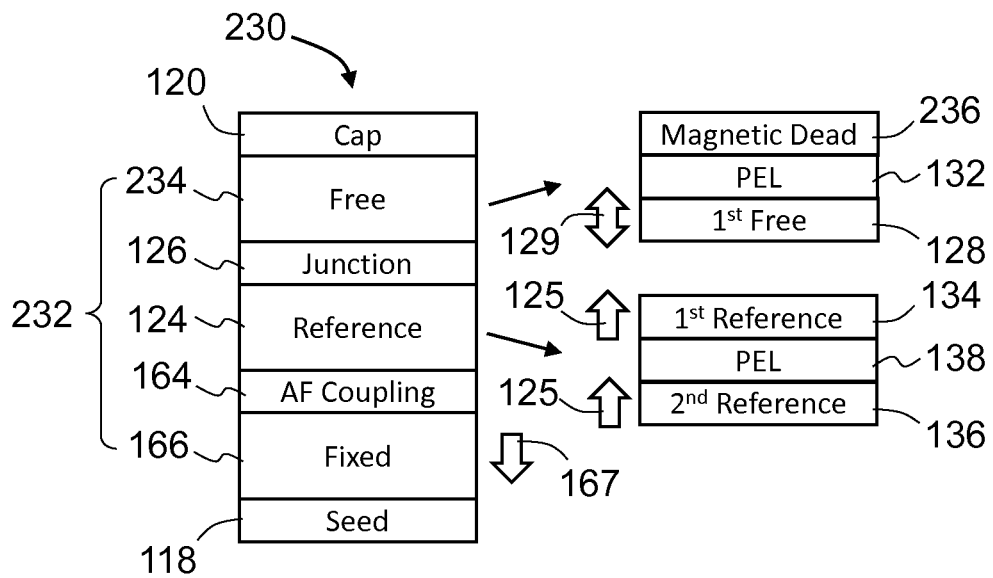
FIGS. 13A and 13B are schematic views of still yet another embodiment of the present invention as applied to a perpendicular MTJ memory element.

Still yet another embodiment of the present invention as applied to a MTJ memory element is illustrated in FIG. 13A. The memory element 230 includes a magnetic tunnel junction (MTJ) structure 232 in between a non-magnetic seed layer 118 and a non-magnetic cap layer 120. The MTJ structure 232 comprises a magnetic free layer structure 234 and a magnetic reference layer structure 124 with an insulating tunnel junction layer 126 interposed therebetween, an anti-ferromagnetic coupling layer 164 formed adjacent to the magnetic reference layer structure 124, and a magnetic fixed layer 166 formed adjacent to the anti-ferromagnetic coupling layer 164. The magnetic fixed layer structure 166 and the magnetic free layer structure 234 are formed adjacent to the non-magnetic seed layer 118 and cap layer 120, respectively. The magnetic free layer structure 234 includes a first magnetic free layer 128 formed adjacent to the insulating tunnel junction layer 126 and a magnetic dead layer 236 separated from the first magnetic free layer 128 by a first non-magnetic perpendicular enhancement layer (PEL) 132. The magnetic reference layer structure 124 includes a first magnetic reference layer 134 formed adjacent to the insulating tunnel junction layer 126 and a second magnetic reference layer 136 separated from the first magnetic reference layer 134 by a second non-magnetic perpendicular enhancement layer 138. The first magnetic free layer 128 has first a variable magnetization direction 129 substantially perpendicular to the layer plane thereof. The first and second magnetic reference layers 134 and 136 have a first fixed magnetization direction 125 substantially perpendicular to the layer plane thereof. The magnetic fixed layer 166 has a second fixed magnetization direction 167 that is substantially perpendicular to the layer plane thereof and is substantially opposite to the first fixed magnetization direction 125. The memory element 230 of FIG. 13A is different from the memory element 160 of FIG. 6A in that the second magnetic free layer 130 of the memory element 160 is replaced by the magnetic dead layer 236.

Figure 13B:
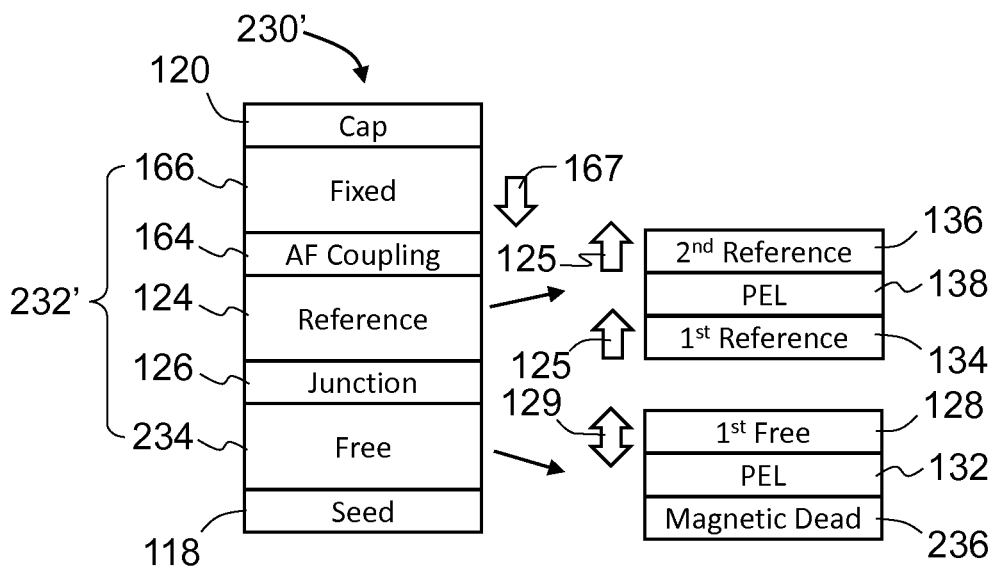

The stacking order of the individual layers in the MTJ structure 232 of the memory element 230 may be inverted as illustrated in FIG. 13B without affecting the device performance. The memory element 230' of FIG. 13B has a MTJ structure 232' that has the same layers but with the inverted stacking order comparing to the MTJ structure 232. Accordingly, the magnetic free layer structure 234 and the magnetic fixed layer structure 166 are formed adjacent to the non-magnetic seed layer 118 and cap layer 120, respectively.

Figure 14A:
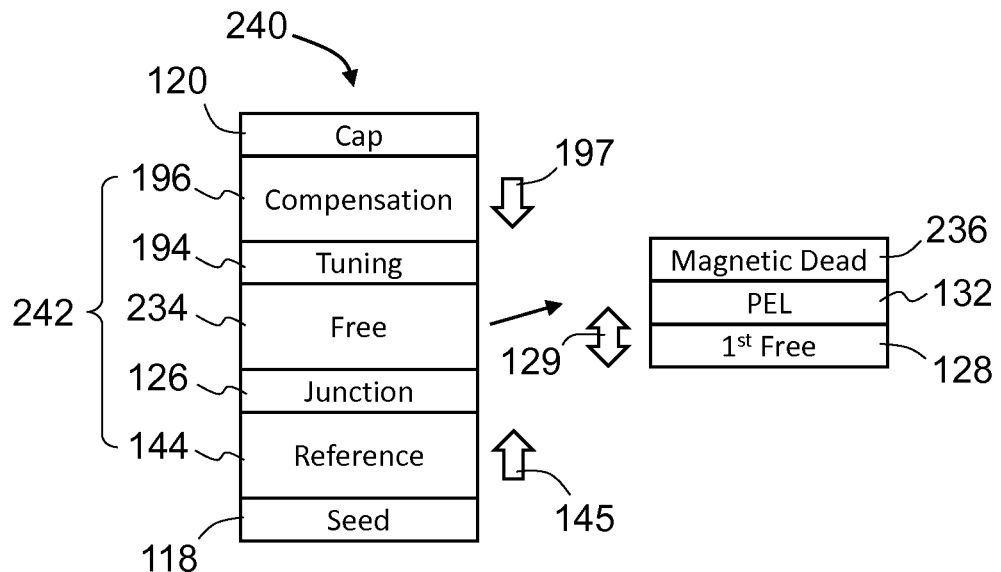
FIGS. 14A and 14B are schematic views of yet still another embodiment of the present invention as applied to a perpendicular MTJ memory element.

Yet still another embodiment of the present invention as applied to a MTJ memory element is illustrated in FIG. 14A. The memory element 240 includes a magnetic tunnel junction (MTJ) structure 242 in between a non-magnetic seed layer 118 and a non-magnetic cap layer 120. The MTJ structure 242 comprises a magnetic free layer structure 234 and a magnetic reference layer structure 144 with an insulating tunnel junction layer 126 interposed therebetween, a non-magnetic tuning layer 194 formed adjacent to the magnetic free layer structure 234, and a magnetic compensation layer 196 formed adjacent to the non-magnetic tuning layer 194. The magnetic reference layer structure 144 and the magnetic compensation layer 196 are formed adjacent to the non-magnetic seed layer 118 and cap layer 120, respectively. The magnetic free layer structure 234 includes a first magnetic free layer 128 formed adjacent to the insulating tunnel junction layer 126 and a magnetic dead layer 236 separated from the first magnetic free layer 128 by a non-magnetic perpendicular enhancement layer (PEL) 132. The first magnetic free layer 128 has a first variable magnetization direction 129 substantially perpendicular to the layer plane thereof. The magnetic reference layer structure 144 has a first fixed magnetization direction 145 substantially perpendicular to the layer plane thereof. The magnetic compensation layer 196 has a second fixed magnetization direction 197 that is substantially perpendicular to the layer plane thereof and is substantially opposite to the first fixed magnetization direction 145. The memory element 240 of FIG. 14A is different from the memory element 200 of FIG. 10A in that the second magnetic free layer 130 of the memory element 200 is replaced by the magnetic dead layer 236.

Figure 14B:
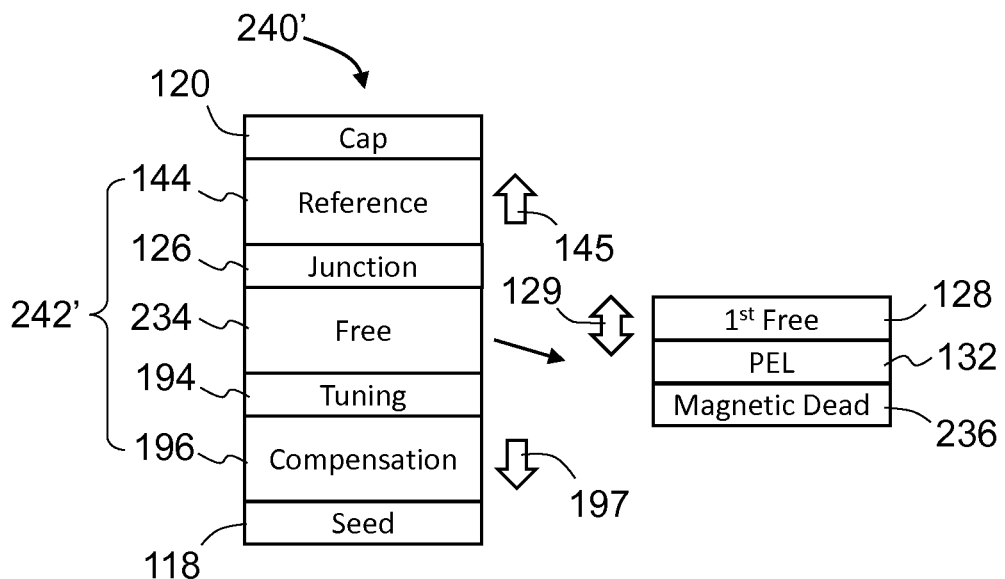

The stacking order of the individual layers in the MTJ structure 242 of the memory element 240 may be inverted as illustrated in FIG. 14B without affecting the device performance. The memory element 240' of FIG. 14B has a MTJ structure 242' that has the same layers but with the inverted stacking order comparing to the MTJ structure 242. Accordingly, the magnetic compensation layer 196 and the magnetic reference layer structure 144 are formed adjacent to the non-magnetic seed layer 118 and cap layer 120, respectively.

Figure 15A:
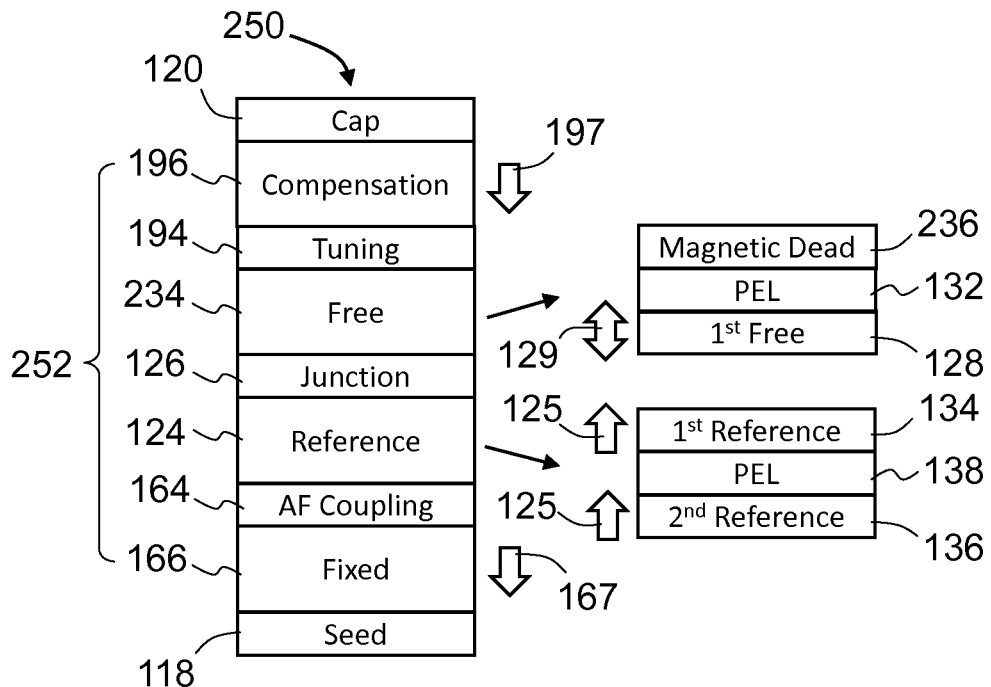
FIGS. 15A and 15B are schematic views of still yet another embodiment of the present invention as applied to a perpendicular MTJ memory element.

Still yet another embodiment of the present invention as applied to a perpendicular MTJ memory element is illustrated in FIG. 15A. The memory element 250 includes a magnetic tunnel junction (MTJ) structure 252 in between a non-magnetic seed layer 118 and a non-magnetic cap layer 120. The MTJ structure 250 comprises a magnetic free layer structure 234 and a magnetic reference layer structure 124 with an insulating tunnel junction layer 126 interposed therebetween, a non-magnetic tuning layer 194 formed adjacent to the magnetic free layer structure 122 opposite the insulating tunnel junction layer 126, a magnetic compensation layer 196 formed adjacent to the non-magnetic tuning layer 194 opposite the magnetic free layer structure 122, an anti-ferromagnetic coupling layer 164 formed adjacent to the magnetic reference layer structure 124 opposite the insulating tunnel junction layer 126, and a magnetic fixed layer 166 formed adjacent to the anti-ferromagnetic coupling layer 164 opposite the magnetic reference layer structure 124. The magnetic fixed layer 166 and the magnetic compensation layer 196 are formed adjacent to the non-magnetic seed layer 118 and cap layer 120, respectively. The magnetic free layer structure 234 includes a first magnetic free layer 128 formed adjacent to the insulating tunnel junction layer 126 and a magnetic dead layer 236 separated from the first magnetic free layer 128 by a first non-magnetic perpendicular enhancement layer (PEL) 132. The magnetic reference layer structure 124 includes a first magnetic reference layer 134 formed adjacent to the insulating tunnel junction layer 126 and a second magnetic reference layer 136 separated from the first magnetic reference layer 134 by a second non-magnetic perpendicular enhancement layer 138. The first magnetic free layer 128 has a first variable magnetization direction 129 substantially perpendicular to the layer plane thereof. The first and second magnetic reference layers 134 and 136 have a first fixed magnetization direction 125 substantially perpendicular to the layer plane thereof. The magnetic compensation layer 196 has a second fixed magnetization direction 197 substantially opposite to the first fixed magnetization direction 125. The magnetic fixed layer 166 has a third fixed magnetization direction 167 that is substantially perpendicular to the layer plane thereof and is substantially opposite to the first fixed magnetization direction 125. The memory element 250 of FIG. 15A is different from the memory element 220 of FIG. 12A in that the second magnetic free layer 130 of the memory element 220 is replaced by the magnetic dead layer 236.

Figure 15B:
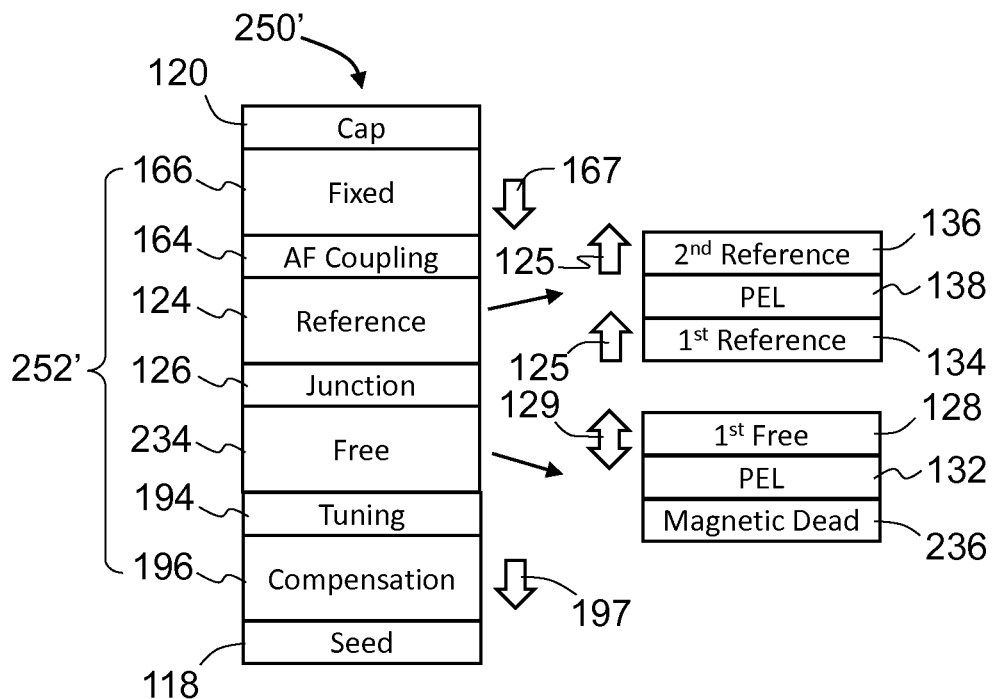

The stacking order of the individual layers in the MTJ structure 252 of the memory element 250 may be inverted as illustrated in FIG. 15B without affecting the device performance. The memory element 250' of FIG. 15B has a MTJ structure 252' that has the same layers but with the inverted stacking order comparing with the MTJ structure 252. Accordingly, the magnetic compensation layer 196 and the magnetic fixed layer 166 are formed adjacent to the non-magnetic seed layer 118 and cap layer 120, respectively.

Figure 16A:
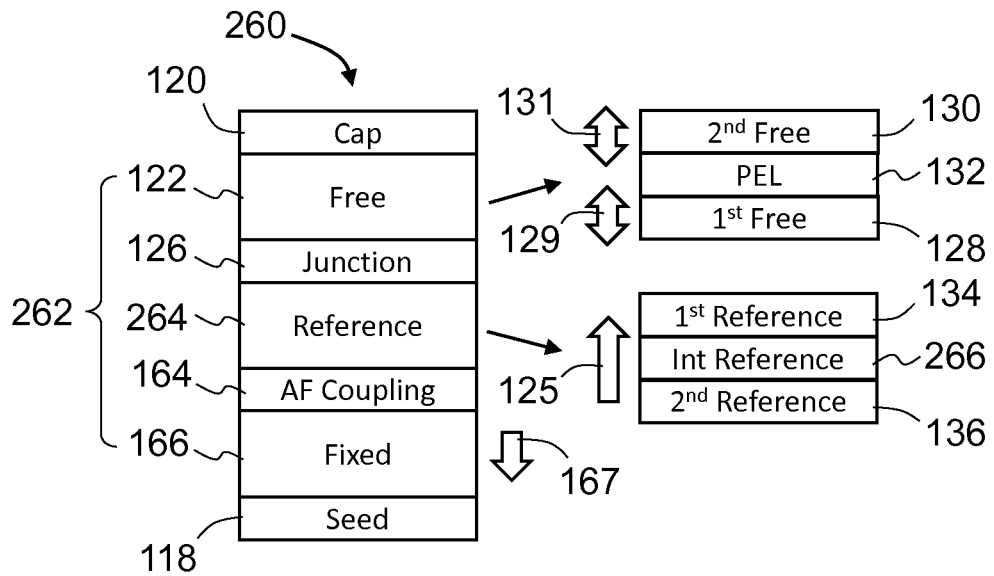
FIGS. 16A and 16B are schematic views of yet still another embodiment of the present invention as applied to a perpendicular MTJ memory element.

Yet still another embodiment of the present invention as applied to a MTJ memory element is illustrated in FIG. 16A. The memory element 260 includes a magnetic tunnel junction (MTJ) structure 262 in between a non-magnetic seed layer 118 and a non-magnetic cap layer 120. The MTJ structure 262 comprises a magnetic free layer structure 122 and a magnetic reference layer structure 264 with an insulating tunnel junction layer 126 interposed therebetween, an anti-ferromagnetic coupling layer 164 formed adjacent to the magnetic reference layer structure 264, and a magnetic fixed layer 166 formed adjacent to the anti-ferromagnetic coupling layer 164 opposite the magnetic reference layer structure 264. The magnetic fixed layer structure 166 and the magnetic free layer structure 122 are formed adjacent to the non-magnetic seed layer 118 and cap layer 120, respectively. The magnetic free layer structure 122 includes a first magnetic free layer 128 formed adjacent to the insulating tunnel junction layer 126 and a second magnetic free layer 130 separated from the first magnetic free layer 128 by a non-magnetic perpendicular enhancement layer (PEL) 132. The magnetic reference layer structure 264 includes a first magnetic reference layer 134 formed adjacent to the insulating tunnel junction layer 126 and a second magnetic reference layer 136 separated from the first magnetic reference layer 134 by an intermediate magnetic reference layer 266. The first and the second magnetic free layers 128 and 130 have respectively a first and a second variable magnetization directions 129 and 131 substantially perpendicular to the layer plane thereof. The first and the second variable magnetization directions 129 and 131 may be parallel or anti-parallel to each other. The first, second, and intermediate magnetic reference layers 134, 136, and 266 have a first fixed magnetization direction 125 substantially perpendicular to the layer plane thereof. The magnetic fixed layer 166 has a second fixed magnetization direction 167 substantially opposite to the first fixed magnetization direction 125. The memory element 260 of FIG. 16A is different from the memory element 160 of FIG. 6A in that the perpendicular enhancement layer 138 of the memory element 160 is replaced by the intermediate magnetic reference layer 266.

Figure 16B:
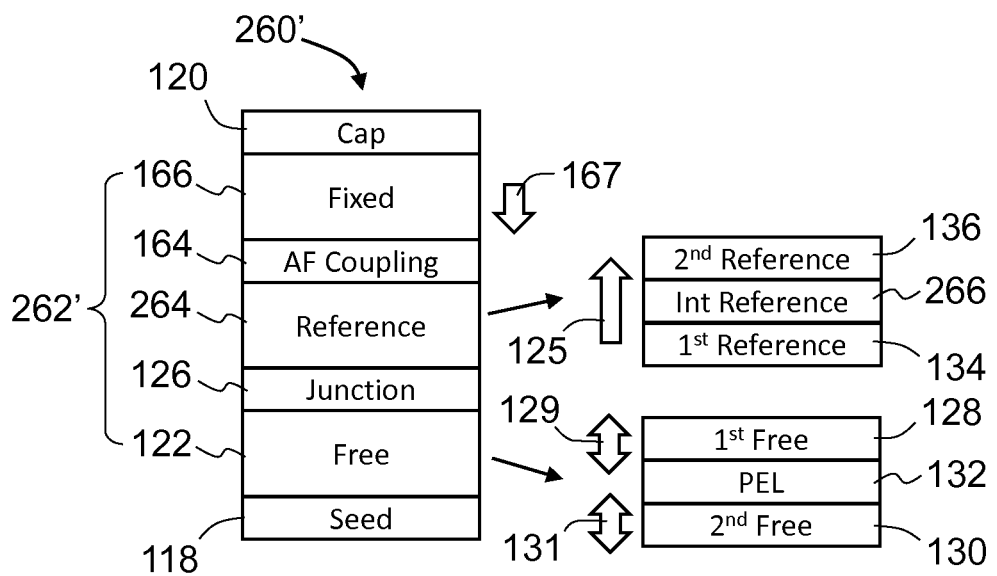

The stacking order of the individual layers in the MTJ structure 262 of the memory element 260 may be inverted as illustrated in FIG. 16B without affecting the device performance. The memory element 260' of FIG. 16B has a MTJ structure 262' that has the same layers but with the inverted stacking order comparing with the MTJ structure 262. Accordingly, the magnetic free layer structure 122 and the magnetic fixed layer structure 166 are formed adjacent to the non-magnetic seed layer 118 and cap layer 120, respectively.

Figure 17A:
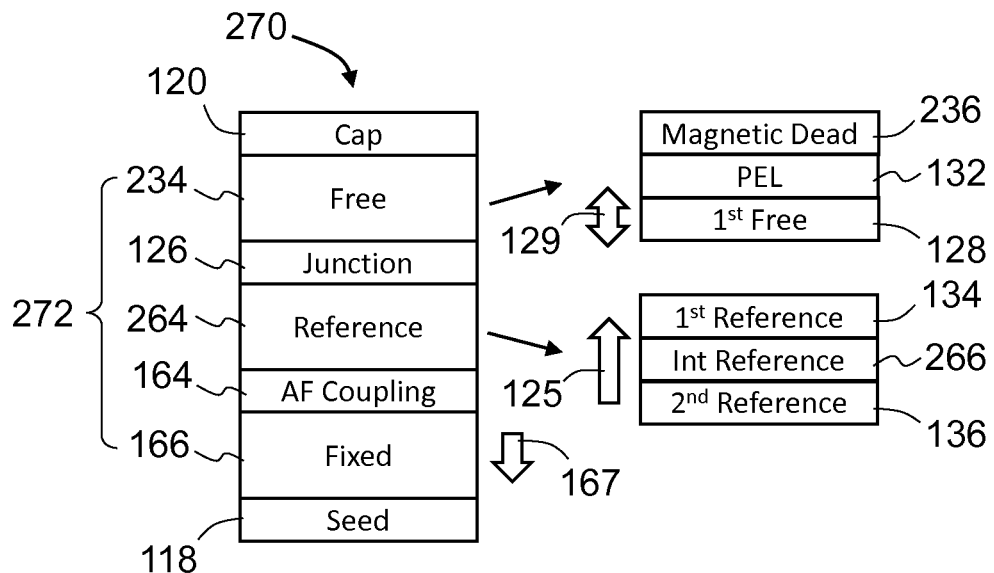
FIGS. 17A and 17B are schematic views of still yet another embodiment of the present invention as applied to a perpendicular MTJ memory element.

Still yet another embodiment of the present invention as applied to a MTJ memory element is illustrated in FIG. 17A. The memory element 270 includes a magnetic tunnel junction (MTJ) structure 272 in between a non-magnetic seed layer 118 and a non-magnetic cap layer 120. The MTJ structure 272 comprises a magnetic free layer structure 234 and a magnetic reference layer structure 264 with an insulating tunnel junction layer 126 interposed therebetween, an anti-ferromagnetic coupling layer 164 formed adjacent to the magnetic reference layer structure 264, and a magnetic fixed layer 166 formed adjacent to the anti-ferromagnetic coupling layer 164 opposite the magnetic reference layer structure 264. The magnetic fixed layer structure 166 and the magnetic free layer structure 234 are formed adjacent to the non-magnetic seed layer 118 and cap layer 120, respectively. The magnetic free layer structure 234 includes a first magnetic free layer 128 formed adjacent to the insulating tunnel junction layer 126 and a magnetic dead layer 236 separated from the first magnetic free layer 128 by a non-magnetic perpendicular enhancement layer (PEL) 132. The magnetic reference layer structure 264 includes a first magnetic reference layer 134 formed adjacent to the insulating tunnel junction layer 126 and a second magnetic reference layer 136 separated from the first magnetic reference layer 134 by an intermediate magnetic reference layer 266. The first magnetic free layers 128 has a first variable magnetization direction 129 substantially perpendicular to the layer plane thereof. The first, second, and intermediate magnetic reference layers 134, 136, and 266 have a first fixed magnetization direction 125 substantially perpendicular to the layer plane thereof. The magnetic fixed layer 166 has a second fixed magnetization direction 167 substantially opposite to the first fixed magnetization direction 125. The memory element 270 of FIG. 17A is different from the memory element 260 of FIG. 16A in that the second magnetic free layer 130 of the memory element 260 is replaced by the magnetic dead layer 236.

Figure 17B:
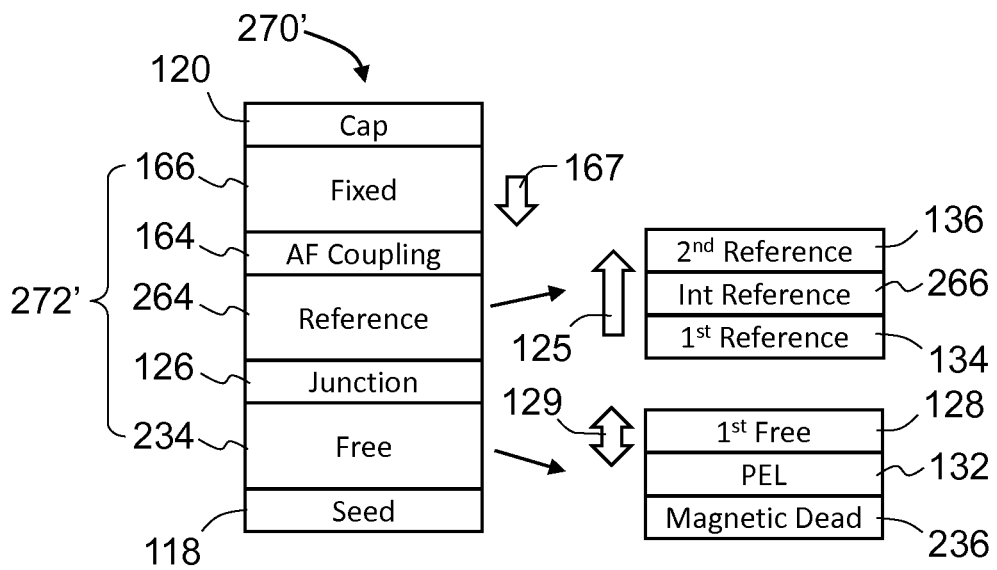

The stacking order of the individual layers in the MTJ structure 272 of the memory element 270 may be inverted as illustrated in FIG. 17B without affecting the device performance. The memory element 270' of FIG. 17B has a MTJ structure 272' that has the same layers but with the inverted stacking order comparing with the MTJ structure 272. Accordingly, the magnetic free layer structure 234 and the magnetic fixed layer structure 166 are formed adjacent to the non-magnetic seed layer 118 and cap layer 120, respectively.

Comparing with the MTJ structures 116, 116', 142, 142', 152, and 152' of FIGS. 3A, 3B, 4A, 4B, 5A, and 5B, respectively, the MTJ structures 192, 192', 202, 202', 212, 212', 222, 222', 242, 242', 252, and 252' of FIGS. 9A, 9B, 10A, 10B, 11A, 11B, 12A, 12B, 14A, 14B, 15A, and 15B, respectively, have the magnetic compensation layer 196 separated from the magnetic free layer structure 122, 154, or 234 by the non-magnetic tuning layer 194. The magnetic compensation layer 196 is not an "active" layer like the magnetic reference layer structure and the magnetic free layer structure, which along with the tunnel junction layer 126 collectively form a MTJ that changes resistivity when a spin-polarized current pass therethrough. The main function of the magnetic compensation layer 196, which has an opposite magnetization direction compared with the magnetic reference layer structures 124 and 144, is to cancel, as much as possible, the external magnetic field exerted by the magnetic reference layer structures 124 and 144 on the magnetic free layer structures 122, 154 and 234, thereby minimizing the offset field or net external field in the magnetic free layer structures 122, 154, and 234.

For the MTJ memory elements 114, 114', 140, 140', 160, 160', 170, 170', 190, 190', 200, 200', 222, 222', 262, and 262' of FIGS. 3A, 3B, 4A, 4B, 6A, 6B, 7A, 7B, 9A, 9B, 10A, 10B, 12A, 12B, 16A, and 16B, respectively, where the magnetic free layer structure 122 comprises the first and second magnetic free layers 128 and 130, the first and second magnetic free layers 128 and 130 each may be formed of a magnetic material comprising cobalt (Co) and iron (Fe), such as but not limited to cobalt-iron (CoFe), cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-nickel (CoFeNi), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), cobalt-iron-phosphorous (CoFeP), or any combination thereof. For the MTJ memory elements 150, 150', 180, 180', 210, and 210' of FIGS. 5A, 5B, 8A, 8B, 11A, and 11B, respectively, where the magnetic free layer structure 154 has a single magnetic layer, the magnetic free layer structure 154 may comprise a magnetic material comprising Co and Fe, such as but not limited to CoFe, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. For the MTJ memory elements 232, 232', 242, 242', 252, 252', 272, and 272' of FIGS. 13A, 13B, 14A, 14B, 15A, 15B, 17A, and 17B, respectively, in which the magnetic free layer structure 234 comprises the first magnetic free layer 128 and the magnetic dead layer 236. The first magnetic free layer 128 may be formed of the same materials as described above for the magnetic free layer structure 122. The magnetic dead layer 236 may comprise one or more ferromagnetic elements, such as but not limited to cobalt, iron, and nickel, and has no net magnetic moment in the absence of an external magnetic field. In one embodiment, the magnetic dead layer 236 has a nominal composition in which one or more ferromagnetic elements collectively account for at least 30 atomic percent.

Figure 18A:
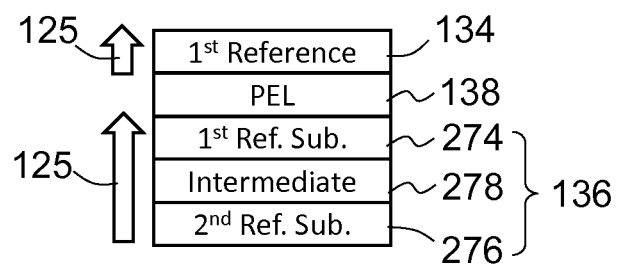
FIGS. 18A and 18B are schematic views of embodiments of the present invention as applied to a magnetic reference layer structure.
Figure 18B:
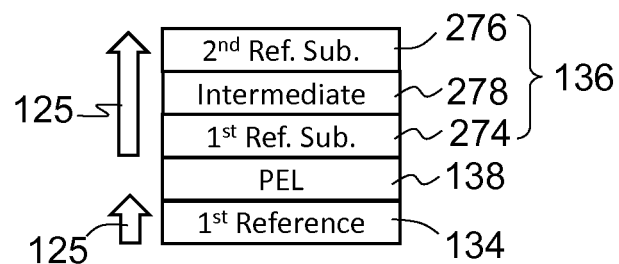

For the MTJ memory elements 114, 114', 150, 150', 160, 160', 180, 180', 190, 190', 210, 210', 220, 220', 230, 230', 250, and 250' of FIGS. 3A, 3B, 5A, 5B, 6A, 6B, 8A, 8B, 9A, 9B, 11A, 11B, 12A, 12B, 13A, 13B, 15A, and 15B, respectively, where the magnetic reference layer structure 124 comprises the first and second magnetic reference layers 134 and 136, the first and second magnetic reference layers 134 and 136 each may be formed of a magnetic material comprising Co and Fe, such as but not limited to CoFe, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. The second magnetic reference layer 136 may alternatively be made of cobalt, iron, or nickel. Moreover, the second magnetic reference layer 136 may also have a magnetic superlattice structure comprising repeated alternating layers of two or more materials, such as but not limited to $(Co/Pt)_n$, $(Co/Pd)_n$, $(Co/Ni)_n$, $(CoFe/Pt)_n$, $(Co/Pt(Pd))_n$, or any combination thereof. In one embodiment, the second magnetic reference layer 136 has a multilayer structure formed by interleaving two different types of materials with at least one of the two different types being magnetic, such as but not limited to $(Co/Pt)_n$, $(Co/Pd)_n$, or $(Co/Ni)_n$. In another embodiment, the second magnetic reference layer 136 comprises a first magnetic reference sublayer 274 formed adjacent to the non-magnetic perpendicular enhancement layer 138 and a second magnetic reference sublayer 276 separated from the first magnetic reference sublayer 274 by an intermediate layer 278 as illustrated in FIGS. 18A and 18B. The first magnetic reference sublayer 274 may be made of a magnetic metal or alloy such as but not limited to Co, CoFe, or CoFeB and may have a thickness in the range of about 0.2 nm to about 0.8 nm. The second magnetic reference sublayer 276 may be made of a magnetic metal or alloy such as but not limited to Co or CoFe and may have a thickness in the range of about 0.2 nm to about 0.8 nm. The intermediate layer 278 may be made of palladium, platinum, or nickel and may have a thickness in the range of about 0.2 nm to about 1.2 nm. Alternatively, the second magnetic reference layer 136 may be formed of a magnetic material comprising Co and Cr, such as but not limited to CoCr, CoCrB, CoCrPt, CoCrPtB, CoCrPd, CoCrTi, CoCrZr, CoCrHf, CoCrV, CoCrNb, CoCrTa, or any combination thereof. For the MTJ memory elements 140, 140', 170, 170', 200, 200', 240, and 240' of FIGS. 4A, 4B, 7A, 7B, 10A, 10B, 14A, and 14B, respectively, where the magnetic reference layer structure 144 comprises a magnetic layer, the magnetic reference layer structure 144 may be formed of a magnetic material comprising Co and Fe, such as but not limited to CoFe, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. For the MTJ memory elements 260, 260', 270, and 270' of FIGS. 16A, 16B, 17A, and 17B, respectively, in which the magnetic reference layer structure 264 comprises the first and second magnetic reference layers 134 and 136 with the intermediate magnetic reference layer 266 interposed therebetween. The first and second magnetic reference layers 134 and 136 each may be formed of the same materials as described above for the magnetic reference layer structure 124. The intermediate magnetic reference layer 266 may be formed of a magnetic material including tantalum as an alloying element, such as but not limited to CoFeBTa, CoFeNiBTa, FeTa, CoTa, FeBTa, CoBTa, NiTa, NiBTa, or any combination thereof. Alternatively, the intermediate magnetic reference layer 266 may be made of a material comprising Co and Fe, such as but not limited to CoFe, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof.

In one embodiment, the first magnetic reference layer 134 of the magnetic reference structures 124 and 264 is made of a material comprising cobalt, iron, and boron, and has a thickness in the range of about 0.8 nm to about 1.2 nm. The second magnetic reference layer 136 of the magnetic reference structures 124 and 264 is made of a material comprising cobalt, iron, and boron, and has a thickness in the range of about 0.6 nm to about 1.5 nm.

For the perpendicular MTJ memory elements 160, 160', 170, 170', 180, 180', 220, 220', 230, 230', 250, 250', 260, 260', 270, and 270' of FIGS. 6A, 6B, 7A, 7B, 8A, 8B, 12A, 12B, 13A, 13B, 15A, 15B, 16A, 16B, 17A, and 17B, respectively, the magnetic fixed layer 166 may be formed of a magnetic material comprising Co and Fe, such as but not limited to CoFe, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. Moreover, the magnetic fixed layer 166 may also have a magnetic superlattice structure comprising repeated alternating layers of two or more materials, such as but not limited to $(Co/Pt)_n$, $(Co/Pd)_n$, $(Co/Ni)_n$, $(CoFe/Pt)_n$, $(Co/Pt(Pd))_n$, or any combination thereof. In one embodiment, the magnetic fixed layer 166 has a multilayer structure formed by interleaving two different types of materials with at least one of the two different types being magnetic, such as but not limited to $(Co/Pt)_n$, $(Co/Pd)_n$, or $(Co/Ni)_n$. Alternatively, the magnetic fixed layer 166 may be formed of a magnetic material comprising Co and Cr, such as but not limited to CoCr, CoCrB, CoCrPt, CoCrPtB, CoCrPd, CoCrTi, CoCrZr, CoCrHf, CoCrV, CoCrNb, CoCrTa, or any combination thereof. The anti-ferromagnetic coupling layer 164, which couples the magnetic fixed layer 166 to the magnetic reference layer structures 124 and 144, may be made of ruthenium (Ru) or tantalum (Ta).

For the perpendicular MTJ memory elements 190, 190', 200, 200', 210, 210', 220, 220', 240, 240', 250, and 250' of FIGS. 9A, 9B, 10A, 10B, 11A, 11B, 12A, 12B, 14A, 14B, 15A, and 15B, respectively, the magnetic compensation layer 196 may be formed of a magnetic material comprising Co and Fe, such as but not limited to CoFe, CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combination thereof. Moreover, the magnetic compensation layer 196 may also have a magnetic superlattice structure comprising repeated alternating layers of two or more materials, such as but not limited to $(Co/Pt)_n$, $(Co/Pd)_n$, $(Co/Ni)_n$, $(CoFe/Pt)_n$, $(Co/Pt(Pd))_n$, or any combination thereof. In one embodiment, the magnetic compensation layer 196 has a multilayer structure formed by interleaving two different types of materials with at least one of the two different types being magnetic, such as but not limited to $(Co/Pt)_n$, $(Co/Pd)_n$, or $(Co/Ni)_n$. Alternatively, the magnetic compensation layer 196 may be formed of a magnetic material comprising Co and Cr, such as but not limited to CoCr, CoCrB, CoCrPt, CoCrPtB, CoCrPd, CoCrTi, CoCrZr, CoCrHf, CoCrV, CoCrNb, CoCrTa, or any combination thereof.

The insulating tunnel junction layer 126 for all perpendicular MTJ elements of FIGS. 3A-17A and 3B-17B may be formed of an insulating material, such as but not limited to magnesium oxide (MgO) or aluminum oxide ($AlO_x$).

The perpendicular enhancement layer (PEL) 132 in the magnetic free layer structure 122 of FIGS. 3A, 3B, 4A, 4B, 6A, 6B, 7A, 7B, 9A, 9B, 10A, 10B, 12A, 12B, 16A, and 16B, and in the magnetic free layer structure 234 of FIGS. 13A, 13B, 14A, 14B, 15A, 15B, 17A, and 17B may be formed of any suitable non-magnetic material. The PEL 132 has a thickness of 3 nm or less, preferably 1 nm or less, more preferably in the range of about 0.2 nm to about 0.5 nm. In an embodiment, the PEL 132 is formed of a PEL oxide, such as but not limited to magnesium oxide (MgO) titanium oxide (TiOx), zirconium oxide (ZrOx), hafnium oxide (HfOx), vanadium oxide (VOx), niobium oxide (NbOx), tantalum oxide (TaOx), chrome oxide (CrOx), molybdenum oxide (MoOx), tungsten oxide (WOx), rhodium oxide (RhOx), nickel oxide (NiOx), palladium oxide (PdOx), platinum oxide (PtOx), copper oxide (CuOx), silver oxide (AgOx), ruthenium oxide (RuOx), silicon oxide (SiOx), or any combination thereof.

In another embodiment, the PEL 132 is formed of a PEL nitride, such as but not limited to titanium nitride (TiNx), zirconium nitride (ZrNx), hafnium nitride (HfNx), vanadium nitride (VNx), niobium nitride (NbNx), tantalum nitride (TaNx), chrome nitride (CrNx), molybdenum nitride (MoNx), tungsten nitride (WNx), nickel nitride (NiNx), palladium nitride (PdNx), platinum oxide (PtOx), ruthenium nitride (RuNx), silicon nitride (SiNx), or any combination thereof.

In still another embodiment, the PEL 132 is formed of a PEL oxynitride, such as but not limited to titanium oxynitride (TiOxNy), zirconium oxynitride (ZrOxNy), hafnium oxynitride (HfOxNy), vanadium oxynitride (VOxNy), niobium oxynitride (NbOxNy), tantalum oxynitride (TaOxNy), chrome oxynitride (CrOxNy), molybdenum oxynitride (MoOxNy), tungsten oxynitride (WOxNy), nickel oxynitride (NiOxNy), palladium oxynitride (PdOxNy), platinum oxyoxide (PtOxNy), ruthenium oxynitride (RuOxNy), silicon oxynitride (SiOxNy) or any combination thereof.

In yet another embodiment, the PEL 132 is formed of a PEL ruthenium oxide based material comprising ruthenium, oxygen, and at least one other element, such as but not limited to TiRuOx, ZrRuOx, HfRuOx, VRuOx, NbRuOx, TaRuOx, CrRuOx, MoRuOx, WRuOx, RhRuOx, NiRuOx, PdRuOx, PtRuOx, CuRuOx, AgRuOx, or any combination thereof.

In still yet another embodiment, the PEL 132 is formed of a PEL metallic material such as Ti, Zr, Hf, V, Nb, Ta, Cr, Mo, W, Rh, Pd, Pt, Cu, Ag, or any combination thereof. The PEL metallic material may also include non-magnetic alloys comprising one or more magnetic elements and one or more non-magnetic elements, such as but not limited to CoTi, CoZr, CoHf, CoV, CoNb, CoTa, CoFeTa, CoCr, CoMo, CoW, NiCr, NiTi, CoNiCr, CoNiTi, or any combination thereof. For these non-magnetic alloys containing magnetic elements, the content of the magnetic elements is below the threshold required for becoming magnetized. Alternatively, the PEL metallic material may also include nominally magnetic materials, such as CoFeB, that have extreme thin thickness, thereby rendering the nominally magnetic materials non-magnetic. For example, CoFeB becomes non-magnetic when the thickness thereof is less than about 0.7 nm.

Figure 19A:
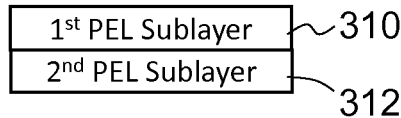
FIGS. 19A and 19B are schematic views of embodiments of the present invention as applied to the perpendicular enhancement layer.
Figure 19B:
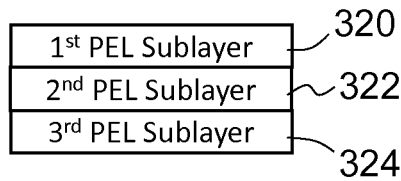

The PEL 132 may include one or more sublayers therein. In an embodiment, the PEL 132 may include a first PEL sublayer 310 and a second PEL sublayer 312 as illustrated in FIG. 19A. The first and second PEL sublayers 310 and 312 each is formed of the above-described PEL oxide, PEL nitride, PEL oxynitride, PEL ruthenium oxide based material, or PEL metallic material. The first PEL sublayer 310 may form adjacent to the first magnetic free layer 128 or the second magnetic free layer 130. In another embodiment, the PEL 132 may include a first PEL sublayer 320, a second PEL sublayer 322, and a third PEL sublayer 324 as illustrated in FIG. 19B. The first, second, and third PEL sublayers 320-324 each may be formed of the above-described PEL oxide, PEL nitride, PEL oxynitride, PEL ruthenium oxide based material, or PEL metallic material. The first PEL sublayer 320 may form adjacent to the first magnetic free layer 128 or the second magnetic free layer 130.

The perpendicular enhancement layer (PEL) 138 in the magnetic reference layer structure 124 of FIGS. 3A, 3B, 5A, 5B, 6A, 6B, 8A, 8B, 9A, 9B, 11A, 11B, 12A, 12B, 13A, 13B, 15A, and 15B may include one or more sublayers therein. The PEL 138 has a thickness of 3 nm or less, preferably 1 nm or less, more preferably in the range of about 0.2 nm to about 0.5 nm. In an embodiment, the PEL 138 is formed of the above-described PEL oxide, PEL nitride, PEL oxynitride, PEL ruthenium oxide based material, or PEL metallic material. In another embodiment, the PEL layer 138 includes a first PEL sublayer 310 and a second PEL sublayer 312 as illustrated in FIG. 19A. The first and second PEL sublayers 310 and 312 each is formed of the above-described PEL oxide, PEL nitride, PEL oxynitride, PEL ruthenium oxide based material, or PEL metallic material. The first PEL sublayer 310 may form adjacent to the first magnetic reference layer 134 or the second magnetic reference layer 136. In still another embodiment, the first PEL sublayer 310 is formed adjacent to the first magnetic reference layer 134 and is made of tantalum or tantalum nitride, while the second PEL sublayer 312 is formed adjacent to the second magnetic reference layer 136 and is made of ruthenium. In yet another embodiment, the PEL layer 138 includes a first PEL sublayer 320, a second PEL sublayer 322, and a third PEL sublayer 324 as illustrated in FIG. 19B. The first, second, and third PEL sublayers 320-324 each is formed of the above-described PEL oxide, PEL nitride, PEL oxynitride, PEL ruthenium oxide based material, or PEL metallic material. The first PEL sublayer 320 may form adjacent to the first magnetic reference layer 134 or the second magnetic reference layer 136.

Figure 20A:
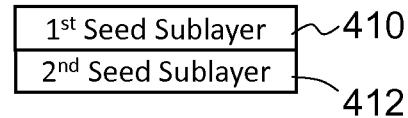
FIGS. 20A and 20B are schematic views of embodiments of the present invention as applied to the non-magnetic seed layer.
Figure 20B:
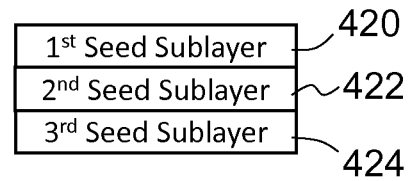

The non-magnetic seed layer 118 of FIGS. 3-17A and 3-17B may include one or more sublayers therein. In an embodiment, the non-magnetic seed layer 118 is formed of the above-described PEL oxide, PEL nitride, PEL oxynitride, PEL ruthenium oxide based material, or PEL metallic material. In another embodiment, the non-magnetic seed layer 118 includes a first seed sublayer 410 and a second seed sublayer 412 as illustrated in FIG. 20A. The first and second seed sublayers 410 and 412 each is formed of the above-described PEL oxide, PEL nitride, PEL oxynitride, PEL ruthenium oxide based material, or PEL metallic material. The first seed sublayer 410 or the second seed sublayer 412 may form adjacent to one of the magnetic layer structures 122, 124, 144, 154, and 234 or one of the magnetic layers 166 and 196. In still another embodiment, the non-magnetic seed layer 118 includes a first seed sublayer 420, a second seed sublayer 422, and a third seed sublayer 424 as illustrated in FIG. 20B. The first, second, and third seed sublayers 420-424 each is formed of the above-described PEL oxide, PEL nitride, PEL oxynitride, PEL ruthenium oxide based material, or PEL metallic material. The first seed sublayer 420 or the third seed sublayer 424 may form adjacent to one of the magnetic layer structures 122, 124, 144, 154, and 234 or one of the magnetic layers 166 and 196.

Figure 21A:
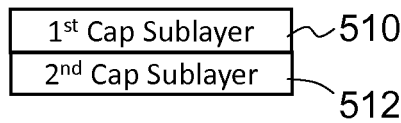
FIGS. 21A and 21B are schematic views of embodiments of the present invention as applied to the non-magnetic cap layer.
Figure 21B:
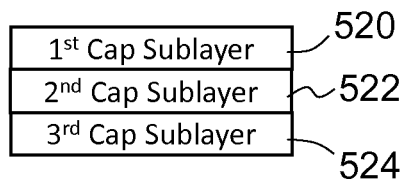

The non-magnetic cap layer 120 of FIGS. 3-17A and 3-17B may include one or more sublayers therein. In an embodiment, the non-magnetic cap layer 120 is formed of the above-described PEL oxide, PEL nitride, PEL oxynitride, PEL ruthenium oxide based material, or PEL metallic material. In another embodiment, the non-magnetic cap layer 120 includes a first cap sublayer 510 and a second cap sublayer 512 as illustrated in FIG. 21A. The first and second cap sublayers 510 and 512 each is formed of the above-described PEL oxide, PEL nitride, PEL oxynitride, PEL ruthenium oxide based material, or PEL metallic material. The first cap sublayer 510 or the second cap sublayer 512 may form adjacent to one of the magnetic layer structures 122, 124, 144, 154, and 234 or one of the magnetic layers 166 and 196. In still another embodiment, the non-magnetic cap layer 120 includes a first cap sublayer 520, a second cap sublayer 522, and a third cap sublayer 524 as illustrated in FIG. 21B. The first, second, and third cap sublayers 520-524 each may be formed of the above-described PEL oxide, PEL nitride, PEL oxynitride, PEL ruthenium oxide based material, or PEL metallic material. The first cap sublayer 520 or the third cap sublayer 524 may form adjacent to one of the magnetic layer structures 122, 124, 144, 154, and 234 or one of the magnetic layers 166 and 196.

Figure 22A:
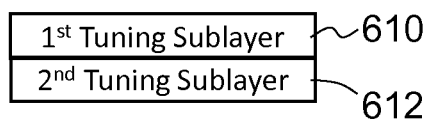
FIGS. 22A and 22B are schematic views of embodiments of the present invention as applied to the non-magnetic tuning layer.
Figure 22B:
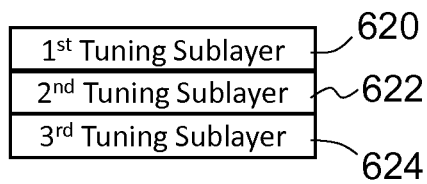

The non-magnetic tuning layer 194 of FIGS. 9-17A and 9-17B may include one or more sublayers therein. In an embodiment, the non-magnetic tuning layer 194 is formed of the above-described PEL oxide, PEL nitride, PEL oxynitride, PEL ruthenium oxide based material, or PEL metallic material. In another embodiment, the non-magnetic tuning layer 194 includes a first tuning sublayer 610 and a second tuning sublayer 612 as illustrated in FIG. 22A. The first and second tuning sublayers 610 and 612 each is formed of the above-described PEL oxide, PEL nitride, PEL oxynitride, PEL ruthenium oxide based material, or PEL metallic material. The first tuning sublayer 610 or the second tuning sublayer 612 may form adjacent to the magnetic compensation layer 196. In still another embodiment, the non-magnetic tuning layer 194 includes a first tuning sublayer 620, a second tuning sublayer 622, and a third tuning sublayer 624 as illustrated in FIG. 22B. The first, second, and third tuning sublayers 620-624 each is formed of the above-described PEL oxide, PEL nitride, PEL oxynitride, PEL ruthenium oxide based material, or PEL metallic material. The first tuning sublayer 620 or the third tuning sublayer 624 may form adjacent to the magnetic compensation layer 196.

The previously described embodiments of the present invention have many advantages, including high perpendicular anisotropy and minimum offset field. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic random access memory (MRAM) device comprising a plurality of memory elements, each of said memory element including a magnetic tunnel junction (MTJ) structure in between a non-magnetic seed layer and a non-magnetic cap layer, said MTJ structure comprising a magnetic free layer structure and a magnetic reference layer structure with an insulating tunnel junction layer interposed therebetween, wherein said magnetic free layer structure includes a first magnetic free layer formed adjacent to said insulating tunnel junction layer and a second magnetic free layer separated from said first magnetic free layer by a second non-magnetic perpendicular enhancement layer (PEL), said first and second magnetic free layers having respectively first and second variable magnetization directions that are substantially perpendicular to layer planes thereof and are oriented in a same direction, said magnetic reference layer structure includes a first magnetic reference layer formed adjacent to said insulating tunnel junction layer and a second magnetic reference layer separated from said first magnetic reference layer by a first non-magnetic perpendicular enhancement layer, said first and second magnetic reference layers having a first fixed magnetization direction substantially perpendicular to layer planes thereof, said second magnetic reference layer having a multilayer structure formed by interleaving two different types of materials with at least one of said two different types being magnetic.

2. The MRAM device according to claim 1, wherein said MTJ structure further comprises:
an anti-ferromagnetic coupling layer formed adjacent to said second magnetic reference layer; and
a magnetic fixed layer formed immediately adjacent to said anti-ferromagnetic coupling layer, said magnetic fixed layer having a second fixed magnetization direction that is perpendicular to a layer plane thereof and is substantially opposite to said first fixed magnetization direction.

3. The MRAM device according to claim 2, wherein said magnetic fixed layer has a multilayer structure formed by interleaving two different types of materials with at least one of said two different types being magnetic.

4. The MRAM device according to claim 3, wherein one of said two different types of materials of said magnetic fixed layer is cobalt and the other one of said two different types of materials is palladium, platinum, or nickel.

5. The MRAM device according to claim 1, wherein one of said two different types of materials of said second magnetic reference layer is cobalt and the other one of said two different types of materials is palladium, platinum, or nickel.

6. The MRAM device according to claim 1, wherein said second magnetic reference layer comprises two magnetic layers with an intermediate metallic layer interposed therebetween.

7. The MRAM device according to claim 6, wherein said two magnetic layers are made of cobalt, said intermediate metallic layer is made of palladium, platinum, or nickel.

8. The MRAM device according to claim 7, wherein each of said two magnetic layers has a thickness in a range of about 0.2 nm to about 0.8 nm, said intermediate layer has a thickness in a range of about 0.2 nm to about 1.2 nm.

9. The MRAM device according to claim 1, wherein each of said first and second non-magnetic perpendicular enhancement layers is made of tantalum or tantalum nitride and has a thickness in a range of about 0.2 nm to about 0.5 nm.

10. A magnetic random access memory (MRAM) device comprising a plurality of memory elements, each of said memory element including a magnetic tunnel junction (MTJ) structure in between a non-magnetic seed layer and a non-magnetic cap layer, said MTJ structure comprising a magnetic free layer structure and a magnetic reference layer structure with an insulating tunnel junction layer interposed therebetween, wherein said magnetic free layer structure has a variable magnetization direction substantially perpendicular to layer plane thereof, said magnetic reference layer structure includes a first magnetic reference layer formed adjacent to said insulating tunnel junction layer and a second magnetic reference layer separated from said first magnetic reference layer by a first non-magnetic perpendicular enhancement layer, said first and second magnetic reference layers have a first fixed magnetization direction substantially perpendicular to layer planes thereof, said second magnetic reference layer has a multilayer structure formed by interleaving two different types of materials with at least one of said two different types being magnetic, said first non-magnetic perpendicular enhancement layer comprises a tantalum layer formed adjacent to said first magnetic reference layer and a ruthenium layer formed adjacent to said second magnetic reference layer.

11. The MRAM device according to claim 10, wherein said magnetic free layer structure includes a first magnetic free layer formed adjacent to said insulating tunnel junction layer and a second magnetic free layer separated from said first magnetic free layer by a second non-magnetic perpendicular enhancement layer.

* * * * *